(12) United States Patent
Fukagawa et al.

(10) Patent No.: US 12,349,536 B2
(45) Date of Patent: Jul. 1, 2025

(54) ELECTRO-OPTICAL DEVICE AND ELECTRONIC APPARATUS

(71) Applicant: SEIKO EPSON CORPORATION, Tokyo (JP)

(72) Inventors: Takefumi Fukagawa, Fujimi-machi (JP); Jun Irobe, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 453 days.

(21) Appl. No.: 17/513,894

(22) Filed: Oct. 29, 2021

(65) Prior Publication Data
US 2022/0140008 A1    May 5, 2022

(30) Foreign Application Priority Data

Oct. 29, 2020   (JP) .................................. 2020-181332

(51) Int. Cl.
| | |
|---|---|
| *H10K 59/38* | (2023.01) |
| *H10K 50/844* | (2023.01) |
| *H10K 50/858* | (2023.01) |
| *H10K 59/122* | (2023.01) |
| *H10K 59/123* | (2023.01) |
| *H10K 50/852* | (2023.01) |
| *H10K 50/856* | (2023.01) |

(52) U.S. Cl.
CPC ....... *H10K 50/8445* (2023.02); *H10K 50/858* (2023.02); *H10K 59/122* (2023.02); *H10K 59/123* (2023.02); *H10K 59/38* (2023.02); *H10K 50/852* (2023.02); *H10K 50/856* (2023.02)

(58) Field of Classification Search
CPC ............... H10K 50/852; H10K 50/856; H10K 50/8445; H10K 2102/3026; H10K 59/124; H10K 59/1315; H10K 59/38; H10K 59/122; H10K 59/123; H10K 50/858

See application file for complete search history.

(56) References Cited

U.S. PATENT DOCUMENTS

| | | |
|---|---|---|
| 8,944,616 B2 | 2/2015 | Ichinose et al. |
| 2006/0105490 A1 | 5/2006 | Watanabe |
| 2008/0160664 A1 | 7/2008 | Yun et al. |

(Continued)

FOREIGN PATENT DOCUMENTS

| | | |
|---|---|---|
| CN | 102856349 | 1/2013 |
| JP | 2006140370 | 6/2006 |

(Continued)

OTHER PUBLICATIONS

Soman et al. Broad range refractive index engineering of $SiN_x$, Materials Chemistry and Physics, 197 (Year: 2017).*

*Primary Examiner* — Galina G Yushina
(74) *Attorney, Agent, or Firm* — JCIPRNET

(57) ABSTRACT

An electro-optical device includes a light-emitting element, a colored layer corresponding to the light-emitting element, a first inorganic insulating film disposed between the light-emitting element and the colored layer, the first inorganic insulating film including a lens surface having a curved shape, and a second inorganic insulating film disposed, between the light-emitting element and the first inorganic insulating film, so as to be in contact with the first inorganic insulating film, in which an etching rate of the second inorganic insulating film is lower than an etching rate of the first inorganic insulating film.

7 Claims, 11 Drawing Sheets

(56) References Cited

U.S. PATENT DOCUMENTS

| | | | | |
|---|---|---|---|---|
| 2010/0065861 A1* | 3/2010 | Nagai | ............ | H01L 33/38 |
| | | | | 257/E33.067 |
| 2011/0042702 A1* | 2/2011 | Lim | ............ | H10K 50/844 |
| | | | | 257/E33.059 |
| 2013/0002690 A1 | 1/2013 | Ichinose et al. | | |
| 2015/0205014 A1 | 7/2015 | Akasaka | | |
| 2019/0251318 A1 | 8/2019 | Jung et al. | | |
| 2019/0363107 A1 | 11/2019 | Matsusaki et al. | | |
| 2019/0393285 A1 | 12/2019 | Kato | | |
| 2020/0319382 A1* | 10/2020 | Guo | ............ | G02B 1/002 |
| 2021/0005688 A1 | 1/2021 | Shinya et al. | | |
| 2021/0376286 A1* | 12/2021 | Fujimaki | ............ | H10K 50/841 |
| 2022/0115629 A1* | 4/2022 | Suzuki | ............ | H10K 50/858 |

FOREIGN PATENT DOCUMENTS

| | | | | | |
|---|---|---|---|---|---|
| JP | 2008243379 | * | 3/2008 | ............ | H01L 23/35 |
| JP | 2008166773 | | 7/2008 | | |
| JP | 2015138078 | | 7/2015 | | |
| WO | 2018135189 | | 7/2018 | | |
| WO | 2018139171 | | 8/2018 | | |
| WO | 2019159641 | | 8/2019 | | |
| WO | 2020100862 | | 5/2020 | | |
| WO | 2020111101 | | 6/2020 | | |

* cited by examiner

ELECTRO-OPTICAL DEVICE AND ELECTRONIC APPARATUS

The present application is based on, and claims priority from JP Application Serial Number 2020-181332, filed Oct. 29, 2020, the present disclosure of which is hereby incorporated by reference herein in its entirety.

BACKGROUND

1. Technical Field

The present disclosure relates to an electro-optical device and an electronic apparatus.

2. Related Art

There is known an electro-optical device such as a display device including a light-emitting element such as an organic electroluminescence (EL) element.

The display device described in WO 2018/139171 includes a light-emitting element and a protective film disposed upward of the light-emitting element. The protective film is formed by depositing silicon nitride using a chemical vapor deposition (CVD) method. In addition, convex portions protruding to other regions are present in some regions of the light-emitting element. The upper surface of the protective film has a substantially spherical convex shape in accordance with the convex shape of the convex portion. This causes the upper surface of the protective film to function as a collector lens.

Unfortunately, when the convex portion is present downward of the protective film, there is a risk that the convex portion may nucleate and sealing defects may occur in a protective layer. As a result, there is a risk that the function of the protective layer for protecting the light-emitting element may deteriorate. In addition, when forming a lens by etching a known protective layer without providing the convex portion, it is difficult to form the lens by etching in the configuration of the known protective layer. Thus, in the known configuration, it is difficult to achieve both high sealing performance, and improvement in light extraction efficiency or viewing angle characteristics due to the possession of a lens function.

SUMMARY

One aspect of an electro-optical device according to the present disclosure includes a light-emitting element, a colored layer corresponding to the light-emitting element, a first inorganic insulating film disposed between the light-emitting element and the colored layer, the first inorganic insulating film including a lens surface having a curved shape, and a second inorganic insulating film disposed, between the light-emitting element and the first inorganic insulating film, so as to be in contact with the first inorganic insulating film, in which an etching rate of the second inorganic insulating film is lower than an etching rate of the first inorganic insulating film.

One aspect of an electronic apparatus according to the present disclosure includes the above-described electro-optical device and a control unit that controls an operation of the electro-optical device.

DESCRIPTION OF EXEMPLARY EMBODIMENTS

Figure 1:
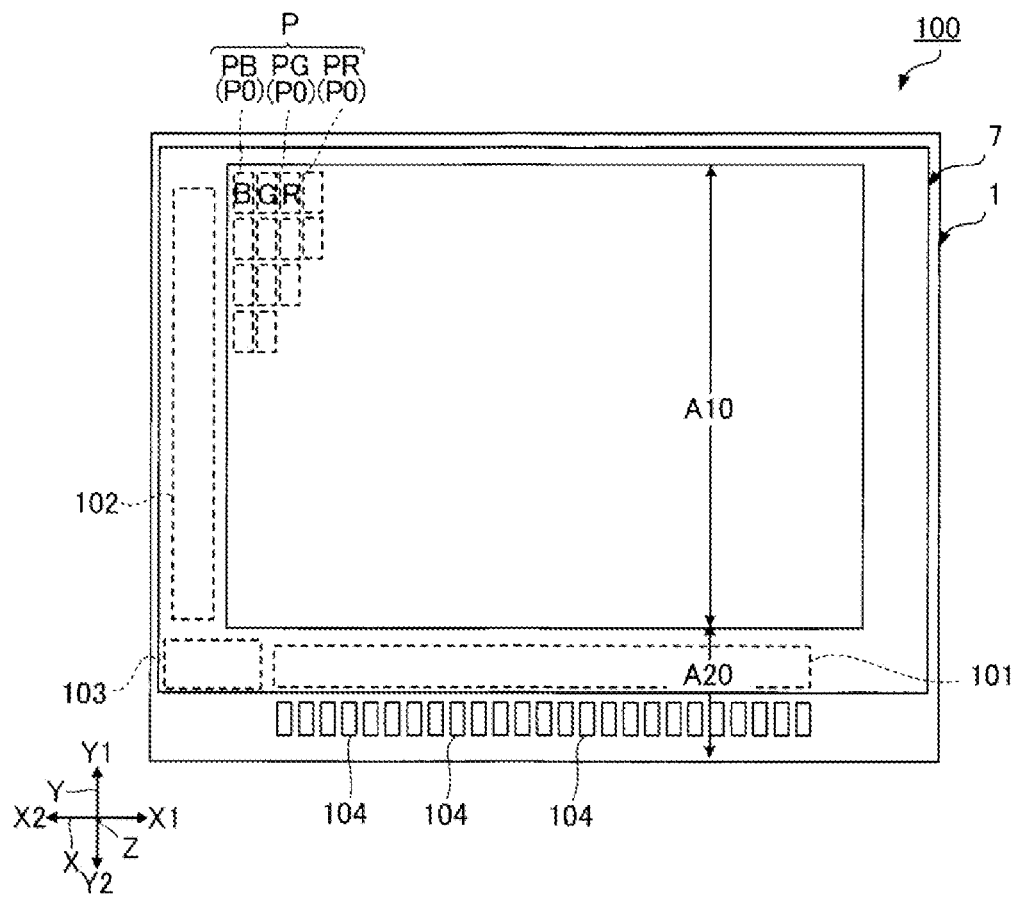
FIG. 1 is a plan view schematically illustrating an electro-optical device of the first embodiment.

Preferred embodiments of the present disclosure will be described below with reference to the accompanying drawings. Note that, in the drawings, dimensions and scales of sections are differed from actual dimensions and scales as appropriate, and some of the sections are schematically illustrated to make them easily recognizable. Also, the scope of the present disclosure is not limited to these embodiments unless otherwise stated to limit the present disclosure in the following descriptions.

1. Electro-Optical Device 100

1A. First Embodiment 1A-1. Overall Configuration of Electro-Optical Device 100

FIG. 1 is a plan view schematically illustrating an electro-optical device 100 of the first embodiment. Note that, in the following, the description will be made appropriately using an X axis, a Y axis, and a Z axis orthogonal to one another, for convenience of explanation. Also, a direction along the X axis is referred to as an X1 direction, and the direction opposite to the X1 direction is referred to as an X2 direction. Similarly, a direction along the Y axis is referred to as a Y1 direction, and the direction opposite to the Y1 direction is referred to as a Y2 direction. A direction along the Z axis is referred to as the Z1 direction, and the direction opposite to the Z1 direction is referred to as a Z2 direction. Viewing the electro-optical device 100 in the Z1 direction or the Z2 direction is referred to as "plan view".

The electro-optical device 100 illustrated in FIG. 1 is an organic EL device that displays full color images by use of organic electroluminescence (EL). Note that the images include an image that indicates only character information. The electro-optical device 100 is a micro display that may be used for a head-mounted display and the like, for example.

The electro-optical device 100 includes a display area A10 in which an image is displayed, and a peripheral area A20 encircling the circumference of the display area A10 in plan view. In the example illustrated in FIG. 1, the display area A10 in plan view is, but not limited to be, in quadrangular shape, and may be in another shape.

The display area A10 has a plurality of pixels P. Each of the pixels P is a minimum unit in image display. In the first embodiment, the plurality of the pixels P are arrayed in rows and columns in the X1 direction and the Y2 direction. Each of the pixels P includes a subpixel PR from which light in a red wavelength range is obtained, a subpixel PB from which light in a blue wavelength range is obtained, and a subpixel PG from which light in a green wavelength range is obtained. One pixel P in a color image is also constituted by the subpixel PB, the subpixel PG, and the subpixel PR. In the following, when the subpixel PB, the subpixel PG, and the subpixel PR are not differentiated, they are represented as a subpixel P0. The subpixel P0 is a component that constitutes the pixel P and is a minimum unit that is individually controlled. In the illustrated example, the subpixels P0 are arrayed in a stripe array.

Note that the red wavelength range exceeds 580 nm and does not exceed 700 nm. The green wavelength range is from 500 nm to 580 nm. The blue wavelength range is from 400 nm to less than 500 nm.

The electro-optical device 100 includes an element substrate 1 and a light-transmissive substrate 7 having light transmissivity. The electro-optical device 100 has a so-called top-emission structure, and emits light from the light-transmissive substrate 7. Note that the direction in which the element substrate 1 overlaps with the light-transmissive substrate 7 coincides with the Z1 direction or the Z2 direction. Also, the light transmissivity refers to transmissivity to visible light, and may mean that the transmissivity of visible light is not less than 50%.

The element substrate 1 includes a data line drive circuit 101, a scanning line drive circuit 102, a control circuit 103, and a plurality of external terminals 104. The data line drive circuit 101, the scanning line drive circuit 102, the control circuit 103, and the plurality of the external terminals 104 are arranged in the peripheral area A20. The data line drive circuit 101 and the scanning line drive circuit 102 are peripheral circuits that control driving of sections constituting the plurality of the subpixels P0. The control circuit 103 controls display of an image. Image data are supplied to the control circuit 103 from a non-illustrated higher circuits. The control circuit 103 supplies various signals based on the image data to the data line drive circuit 101 and the scanning line drive circuit 102. Although not illustrated, Flexible Printed Circuits (FPC) board and the like are coupled to the external terminals 104 for electrical coupling with higher circuits. In addition, a non-illustrated power supply circuit is electrically coupled to the element substrate 1.

The light-transmissive substrate 7 is a cover that protects a light-emitting portion 2 and a color filter 6 that are described later, which are included in the element substrate 1. The light-transmissive substrate 7 is constituted of a glass substrate or a quartz substrate, for example.

Figure 2:
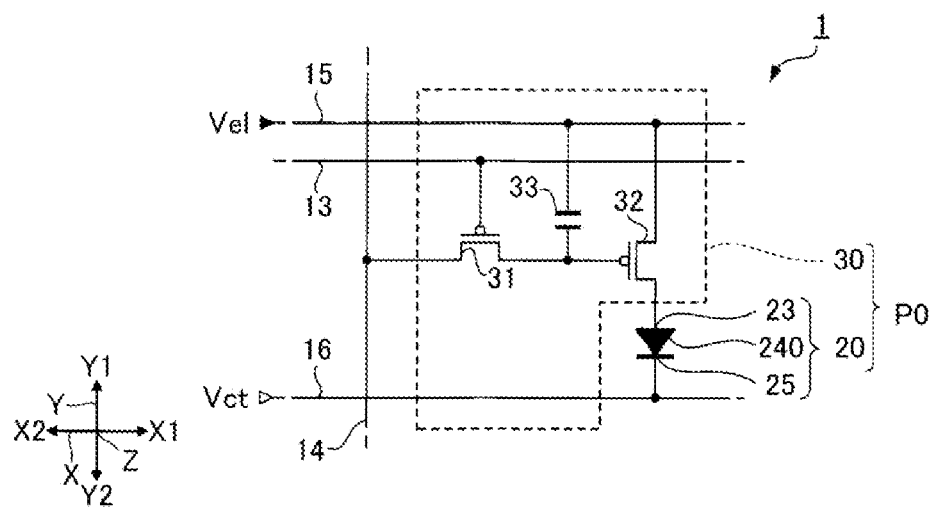
FIG. 2 is an equivalent circuit view of a subpixel illustrated in FIG. 1.

FIG. 2 is an equivalent circuit view of the subpixel P0 illustrated in FIG. 1. The element substrate 1 is provided with a plurality of scanning lines 13, a plurality of data lines 14, a plurality of power supply lines 15, and a plurality of power supply lines 16. In FIG. 2, one subpixel P0 and components corresponding to this are representatively illustrated.

The scanning line 13 extends in the X1 direction and the data line 14 extends in the Y1 direction. Note that, although not illustrated, the plurality of the scanning lines 13 and the plurality of the data lines 14 are arrayed in a lattice pattern. Also, the scanning line 13 is coupled to the scanning line drive circuit 102 illustrated in FIG. 1, and the data line 14 is coupled to the data line drive circuit 101 illustrated in FIG. 1.

As illustrated in FIG. 2, the subpixel P0 includes a light-emitting element 20 and a pixel circuit 30 that controls driving of the light-emitting element 20. The light-emitting element 20 is constituted of an Organic Light-Emitting Diode (OLED). The light-emitting element 20 includes a pixel electrode 23, a common electrode 25, and a light-emitting layer 240.

The pixel electrode 23 is electrically coupled, via the pixel circuit 30, with the power supply line 15. In contrast, the common electrode 25 is electrically coupled with the power supply line 16. Here, a power supply potential Vel on a high potential side is supplied from a non-illustrated power supply circuit to the power supply line 15. A power supply potential Vct on a low potential side is supplied from the non-illustrated power supply circuit to the power supply line 16. The pixel electrode 23 functions as an anode, and the common electrode 25 functions as a cathode. In the light-emitting element 20, holes supplied from the pixel electrode 23 and electrons supplied from the common electrode 25 are recombined in the light-emitting layer 240, whereby the light-emitting layer 240 emits light. Note that the pixel electrode 23 is provided for each of the subpixels P0, and the pixel electrode 23 is controlled independently from the other pixel electrodes 23.

The pixel circuit 30 includes a switching transistor 31, a driving transistor 32, and a retention capacitor 33. A gate of the switching transistor 31 is electrically coupled to the scanning line 13. One of a source or a drain of the switching transistor 31 is also electrically coupled to the data line 14, and the other is electrically coupled to a gate of the driving transistor 32. One of a source or a drain of the driving transistor 32 is also electrically coupled to the power supply line 15, and the other is electrically coupled to the pixel electrode 23. In addition, one of electrodes of the retention capacitor 33 is coupled to the gate of the driving transistor 32, and the other electrode is coupled to the power supply line 15.

In the pixel circuit 30 described above, when the scanning line drive circuit 102 activates a scanning signal to select the scanning line 13, the switching transistor 31 provided in the selected subpixel P0 is turned on. Then, a data signal is supplied from the data line 14 to the driving transistor 32 corresponding to the selected scanning line 13. The driving transistor 32 supplies a current corresponding to the potential of the supplied data signal, that is, a current in response to a potential difference between the gate and the source, to the light-emitting element 20. Then, the light-emitting element 20 emits light at a luminance in response to the magnitude of the current supplied from the driving transistor 32. In addition, when the scanning line drive circuit 102 releases the selection of the scanning line 13 and the switching transistor 31 is turned off, a potential of the gate of the driving transistor 32 is retained by the retention capacitor 33. It is possible for the light-emitting element 20 to maintain emission of light from itself even after the switching transistor 31 is turned off.

Note that the above-described configuration of the pixel circuit 30 is not limited to the illustrated configuration. The pixel circuit 30 may further include a transistor that controls a conduction between the pixel electrode 23 and the driving transistor 32, for example.

1A-2. Element Substrate 1

Figure 3:
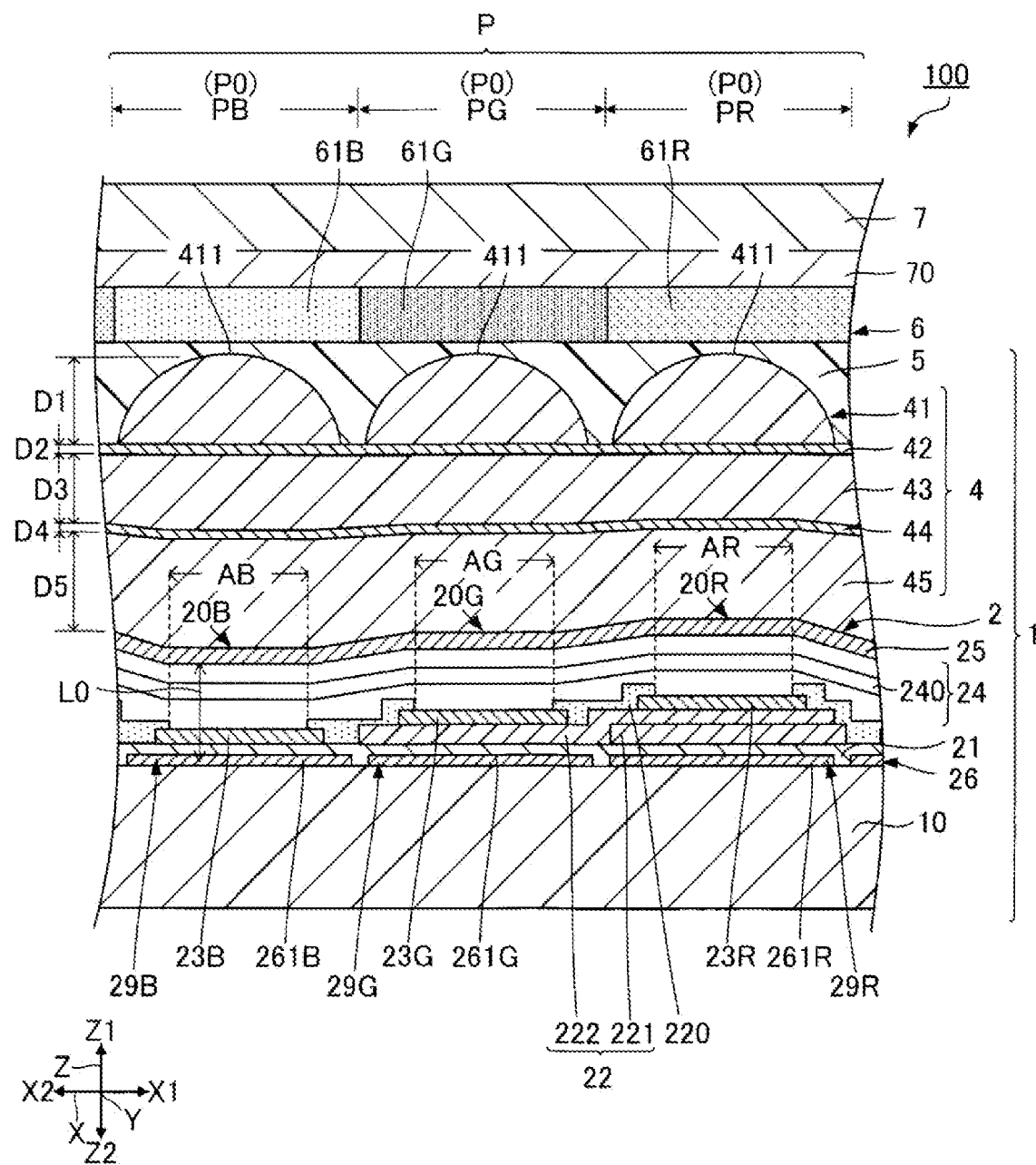
FIG. 3 is a cross-sectional view of a part of an element substrate.

FIG. 3 is a cross-sectional view of a part of the element substrate 1 illustrated in FIG. 1. In FIG. 3, components of one pixel P are representatively illustrated. In the following, an end of the reference sign of the component associated with the subpixel PR is denoted by "R", an end of the reference sign of the component associated with the subpixel PG is denoted by "G", and an end of the reference sign of the component associated with the subpixel PB is denoted by "B". Note that when no distinction is made for each light emission color, the "B", "G", and "R" at the ends of the reference signs are omitted. The following description will be given in a way that the Z1 direction is designated as upward and the Z2 direction as downward.

As illustrated in FIG. 3, the element substrate 1 includes a substrate 10, the light-emitting element 20, a sealing layer 4, a resin layer 5, and the color filter 6. The light-emitting portion 2 includes a plurality of the light-emitting elements 20 described above. Also, in the first embodiment, the sealing layer 4 includes a plurality of lens surfaces 411 for improving the light extraction efficiency. In the following, each of the components of the element substrate 1 will be described.

The substrate 10, while not illustrated in detail, is a wiring board on which the pixel circuit 30 described above is formed on a silicon substrate, for example. Note that, in place of the silicon substrate, a glass substrate, a resin substrate, or a ceramic substrate may be used as well, for example. Also, although not illustrated in detail, each of the above-described transistors included in the pixel circuit 30 may be any of a MOS transistor, a thin film transistor, or a field effect transistor. When a transistor included in the pixel circuit 30 is the MOS transistor including an active layer, the active layer may be constituted of the silicon substrate. In addition, examples of the constituent material of the components and various types of wirings that are included in the pixel circuit 30 include polysilicon, metal, metal silicide, and metallic compound, for example.

The light-emitting portion 2 is disposed on the substrate 10. The light-emitting portion 2 includes a reflective layer 26, an insulating layer 21, an optical path adjustment layer 22, an element isolation layer 220, a plurality of the pixel electrodes 23, an organic layer 24, and the common electrode 25. The light-emitting portion 2 forms the plurality of the light-emitting elements 20 described above using these components. Note that the insulating layer 21, the optical path adjustment layer 22, the element isolation layer 220, the organic layer 24, and the common electrode 25 are shared in the plurality of the light-emitting elements 20. The organic layer 24 also includes the light-emitting layer 240 described above.

The reflective layer 26 is disposed between the substrate 10 and the light-emitting layer 240. The reflective layer 26 includes a plurality of reflective portions 261 having light reflectivity. The light reflectivity refers to reflectivity to visible light, and may mean that the reflectance of visible light is not less than 50%. Each of the reflective portions 261 reflects light generated in the light-emitting layer 240. Note that, the plurality of the reflective portions 261, although not illustrated in the drawings, are arranged corresponding to the plurality of the subpixels P0 in plan view. Examples of the constituent material of the reflective layer 26 include a metal such as Al (aluminum) and Ag (silver), or alloy of these metals, for example. Note that the reflective layer 26 may have a function as a wiring that is electrically coupled to the pixel circuit 30.

The insulating layer 21 is disposed on the reflective layer 26 and fills between the plurality of the reflective portions 261. The insulating layer 21 is composed of a silicon nitride (SiN) film, for example. Also, although not illustrated in the drawings, an enhanced reflective layer having light transmissivity and insulating properties for enhancing light reflectivity of the reflective layer 26 may be disposed between the reflective layer 26 and the insulating layer 21. The enhanced reflective layer includes a silicon oxide film, for example.

The optical path adjustment layer 22 is disposed on the insulating layer 21. The optical path adjustment layer 22 is a layer that adjusts an optical distance L0 being an optical distance between the reflective portions 261 and the common electrode 25 that is described later. The optical path adjustment layer 22 includes a first insulating film 221 and a second insulating film 222. The first insulating film 221 is disposed in the subpixel PR and is not disposed in the subpixels PB and PG. The second insulating film 222 is disposed on the first insulating film 221. The second insulating film 222 is disposed in the subpixels PR and PG and is not disposed in the subpixel PB. Examples of the constituent material of the optical path adjustment layer 22 include a silicon-based inorganic material such as silicon oxide and silicon nitride, for example. Note that the insulating layer 21 described above may be regarded as being responsible for a part of the adjustment of the optical distance L0.

The plurality of the pixel electrodes 23 are arranged on the optical path adjustment layer 22. The pixel electrode 23 is provided for each of the light-emitting elements 20. Although not illustrated, each of the pixel electrodes 23 overlaps the reflective portion 261 corresponding to each pixel electrode 23 in plan view. Each of the pixel electrodes 23 has light transmissivity and electrical conductivity. Examples of the constituent material of the pixel electrode 23 include a transparent conductive material such as Indium Tin Oxide (ITO) or Indium Zinc Oxide (IZO), for example.

The element isolation layer 220 including a plurality of openings is also disposed on the optical path adjustment layer 22. The element isolation layer 220 covers each of the outer edges of the plurality of the pixel electrodes 23. The element isolation layer 220 electrically isolates the plurality of the pixel electrodes 23 from one another. A plurality of light-emitting regions A are defined by the plurality of the openings included in the element isolation layer 220. It is also possible to define the light-emitting region A as a region where the organic layer 24 is in contact with the pixel electrode 23. Specifically, a light-emitting region AR included in a light-emitting element 20R, a light-emitting region AG included in a light-emitting element 20G, and a light-emitting region AB included in a light-emitting element 20B are defined. Examples of the constituent material of the element isolation layer 220 include a silicon-based inorganic material such as silicon oxide and silicon nitride, for example.

The organic layer 24 is disposed on the plurality of the pixel electrodes 23. The light-emitting layer 240 included in the organic layer 24 includes an organic light-emitting material. The organic light-emitting material is a luminescent organic compound. Also, the organic layer 24 includes, in addition to the light-emitting layer 240, a hole injection layer, a hole transport layer, an electron transport layer, an electron injection layer, and the like, for example. The organic layer 24 includes the light-emitting layer 240 for obtaining light emission colors of blue, green, and red to achieve white light emission. Note that the configuration of the organic layer 24 is not particularly limited to the above-described configuration, and a publicly known configuration is applicable thereto.

The common electrode 25 is disposed on the organic layer 24. The common electrode 25 is disposed between the light-emitting layer 240 and the sealing layer 4. The common electrode 25 is a semi-transparent reflective layer having light reflectivity and light transmissivity. The common electrode 25 also has electrical conductivity. The common electrode 25 is formed of an alloy containing Ag such as MgAg, for example.

In the light-emitting portion 2 described above, the light-emitting element 20R includes the reflective portion 261, the insulating layer 21, the first insulating film 221, the second insulating film 222, the element isolation layer 220, a pixel electrode 23R, the organic layer 24, and the common electrode 25. The light-emitting element 20G includes the reflective portion 261, the insulating layer 21, the second insulating film 222, the element isolation layer 220, a pixel electrode 23G, the organic layer 24, and the common electrode 25. The light-emitting element 20B includes the reflective portion 261, the insulating layer 21, the element isolation layer 220, a pixel electrode 23B, the organic layer 24, and the common electrode 25.

Here, the optical distance L0 between the reflective layer 26 and the common electrode 25 differs for each of the subpixels P0. Specifically, the optical distance L0 in the subpixel PR is set corresponding to the red wavelength range. The optical distance L0 in the subpixel PG is set corresponding to the green wavelength range. The optical distance L0 in the subpixel PB is set corresponding to the blue wavelength range.

Accordingly, each of the light-emitting elements 20 has an optical resonance structure 29 that resonates, between the reflective layer 26 and the common electrode 25, light in a predetermined wavelength range. The light-emitting elements 20R, 20G, and 20B have the optical resonance structures 29 that differ from one another. The optical resonance structure 29 causes light emitted by the light-emitting layer 240 included in the organic layer 24 to be multiply reflected between the reflective layer 26 and the common electrode 25, and selectively intensifies light in a predetermined wavelength range. The light-emitting element 20R has an optical resonance structure 29R that intensifies, between the reflective layer 26 and the common electrode 25, light in the red wavelength range. The light-emitting element 20G has an optical resonance structure 29G that intensifies, between the reflective layer 26 and the common electrode 25, light in the green wavelength range. The light-emitting element 20B has an optical resonance structure 29B that intensifies, between the reflective layer 26 and the common electrode 25, light in the blue wavelength range.

A resonant wavelength in the optical resonance structure 29 is determined depending on the optical distance L0. Given that the resonant wavelength is represented by λ0, the following relationship [1] holds true. Note that, in the relationship [1], Φ (rad) represents the sum of the phase shifts that occur during transmission and reflection between the reflective layer 26 and the common electrode 25.

$$\{(2\times L0)/\lambda 0+\Phi\}/(2\pi)=m0 \ (m0 \text{ is an integer}) \quad [1]$$

The optical distance L0 is set such that a peak wavelength of light in a wavelength range to be extracted becomes λ0. By this setting, light in the predetermined wavelength range to be extracted is intensified, whereby the light is increased in intensity and the spectrum of the light is narrowed.

In the first embodiment, the optical distance L0 is adjusted by varying thickness of the optical path adjustment layer 22 for each of the subpixels PB, PG, and PR, as described above. Note that a method for adjusting the optical distance L0 is not limited to the method for adjusting by varying the thickness of the optical path adjustment layer 22. The optical distance L0 may be adjusted by varying the thickness of the pixel electrode 23 for each of the subpixels PB, PG, and PR, for example.

The sealing layer 4 is disposed between the plurality of the light-emitting elements 20 and the color filter 6. The sealing layer 4 has light transmissivity and insulating properties. The sealing layer 4 seals the plurality of the light-emitting elements 20 to protect the plurality of the light-emitting elements 20 from the outside. The sealing layer 4 has gas barrier properties that protect each of the light-emitting elements 20 from the external moisture, oxygen, or the like, for example. Thus, it is possible, by providing the sealing layer 4, to suppress the degradation of the light-emitting elements 20 compared to when the sealing layer 4 is not provided. This increases quality reliability of the electro-optical device 100.

The sealing layer 4 includes a fifth inorganic insulating film 45, a fourth inorganic insulating film 44, a third inorganic insulating film 43, a second inorganic insulating film 42, and a first inorganic insulating film 41. In other words, the sealing layer 4 is a multilayer body of a plurality of the inorganic insulating films that protect the light-emitting element 20. The fifth inorganic insulating film 45, the fourth inorganic insulating film 44, the third inorganic insulating film 43, the second inorganic insulating film 42, and the first inorganic insulating film 41 are layered in this order in a direction away from the substrate 10. Also, in the first embodiment, the first inorganic insulating film 41 includes the plurality of the lens surfaces 411 each of which collects light emitted from the light-emitting element 20.

Each of the fifth inorganic insulating films 45, the fourth inorganic insulating film 44, the third inorganic insulating film 43, the second inorganic insulating film 42, and the first inorganic insulating film 41 are formed of an inorganic material having light transmissivity and insulating properties. The constituent material of each of the insulating films, which is the inorganic material, mitigates a mechanical impact and the like applied from the outside to the light-emitting portion 2 compared to when the constituent material of each of the insulating films is composed of an organic material. It is also possible, when the constituent material of the sealing layer 4 is composed of an inorganic material, to avoid a risk that the constituents of the sealing layer 4 may penetrate into the organic layer 24 compared to when the constituent material of the sealing layer 4 is composed of an organic material. Note that each of the insulating films may contain an organic material. In the following, the inorganic insulating films are described.

The fifth inorganic insulating film 45 is disposed in contact, between the light-emitting element 20 and the fourth inorganic insulating film 44, with the fourth inorganic insulating film 44, and covers the light-emitting element 20. The fifth inorganic insulating film 45 has a function to mitigate the unevenness on the upper surface of the light-emitting portion 2. The predominate material of the fifth inorganic insulating film 45 may be silicon nitride or silicon oxynitride. In the present specification, the predominate material is a material that occupies more than 70% of the constituent materials. The predominate material of the fifth inorganic insulating film 45, which is silicon nitride (SiN) or silicon oxynitride (SiON), enhances the gas barrier properties of the fifth inorganic insulating film 45 compared to when the predominate material is silicon oxide ($SiO_x$).

The fifth inorganic insulating film 45 is formed by a CVD method using a low-temperature plasma, for example. It is possible, by forming the film by the CVD method, to easily form the fifth inorganic insulating film 45 having a desired thickness. The use of plasma also makes it possible to form the film at a lower temperature such as not higher than 100° C. compared to when the plasma is not used, and to reduce, by adjusting an amount of gas, the stress of the fifth inorganic insulating film 45. This makes it possible to suppress a risk of occurrence of cracks and the like in the sealing layer 4.

A thickness D5 of the fifth inorganic insulating film 45 may range from 400 nm to 1000 nm, may preferably range from 500 nm to 900 nm, and may more preferably range from 600 nm to 800 nm. It is possible, when the thickness is within such a range, to particularly enhance the gas barrier properties by the fifth inorganic insulating film 45, and to reduce a risk of occurrence of cracks due to the thickness D5 becoming excessively thick. This further makes it possible to ensure that the upper surface of the sealing layer 4 sufficiently approximates a flat surface.

The fourth inorganic insulating film 44 is disposed in contact, between the light-emitting element 20 and the third inorganic insulating film 43, with the third inorganic insulating film 43, and covers the light-emitting element 20. The fourth inorganic insulating film 44 supplements the defects that may occur in the fifth inorganic insulating film 45 and the third inorganic insulating film 43, and blocks the development of the defects. Defects such as pin holes or cracks, for example, may particularly occur in the fifth inorganic insulating film 45 and the third inorganic insulating film 43 due to the unevenness on a surface of the light-emitting portion 2 or a presence of foreign matters. The presence of the fourth inorganic insulating film 44 can suppress a transmission, via the defects as a path, of moisture and the like in the atmosphere to the organic layer 24, even if defects occur in the fifth inorganic insulating film 45 and the third inorganic insulating film 43.

The predominate material of the fourth inorganic insulating film 44 may be silicon oxide, silicon oxynitride, silicon nitride, or aluminum oxide. The predominate material of the fourth inorganic insulating film 44, which is any one of these materials, can effectively exert the function, by the fourth inorganic insulating film 44, of supplementing defects compared to when the predominate material is other than these materials.

The fourth inorganic insulating film 44 is formed by an atomic layer deposition (ALD) method using a low-temperature plasma, for example. It is possible, by forming the film by the ALD method, to easily form a high density film. This makes it possible, by forming the film by the ALD method, to increase the density of the fourth inorganic insulating film 44 compared to when forming the fourth inorganic insulating film 44 by the CVD method. This thus makes it possible to enhance the function that the fourth inorganic insulating film 44 blocks the development of defects. The use of plasma also makes it possible to form the film at a lower temperature such as not higher than 100° C. compared to when the plasma is not used. This makes it possible to reduce the stress of the fourth inorganic insulating film 44. This thus makes it possible to suppress a risk of occurrence of cracks and the like in the sealing layer 4. Note that the density of the film refers to mass per unit volume. A film with a high density, which suppresses a diffusion speed of molecules migrating in the film, has high barrier properties.

A thickness D4 of the fourth inorganic insulating film 44 may range from 20 nm to 100 nm, may preferably range from 25 nm to 90 nm, and may more preferably range from 30 nm to 80 nm. It is possible, when the thickness of the thickness D4 is within such a range, to particularly exert the function of supplementing defects in the fifth inorganic insulating film 45, and to suppress the manufacturing time of the fourth inorganic insulating film 44 from becoming excessively long.

The third inorganic insulating film 43 is disposed in contact, between the light-emitting element 20 and the second inorganic insulating film 42, with the second inorganic insulating film 42, and covers the light-emitting element 20. The third inorganic insulating film 43 has a function to mitigate the unevenness on the upper surface of the light-emitting portion 2. The predominate material of the third inorganic insulating film 43 may be silicon nitride or silicon oxynitride. It is possible, when the predominate material is such a material, to obtain the same effect as in the fifth inorganic insulating film 45. The third inorganic insulating film 43 is formed by a CVD method using a low-temperature plasma, for example. It is possible, by forming the film by the CVD method, to obtain the same effect as in the fifth inorganic insulating film 45.

A thickness D3 of the third inorganic insulating film 43 may range from 200 nm to 400 nm, may preferably range from 220 nm to 380 nm, and may more preferably range from 250 nm to 350 nm. It is possible, when the thickness of the thickness D4 is within such a range, to particularly enhance the gas barrier properties of the third inorganic insulating film 43, and to reduce a risk of occurrence of cracks due to the thickness D3 of the third inorganic insulating film 43 becoming excessively thick.

The second inorganic insulating film 42 is disposed, between the plurality of the light-emitting elements 20 and the first inorganic insulating film 41, so as to be in contact with the first inorganic insulating film 41, and covers the plurality of the light-emitting elements 20. The second inorganic insulating film 42 has an etching rate lower than the etching rate of the first inorganic insulating film 41. Specifically, the second inorganic insulating film 42 has a lower etching rate to fluorine-based etchant than the first inorganic insulating film 41. This causes the second inorganic insulating film 42 to function as an etching stopper layer during the manufacture of the first inorganic insulating film 41. The second inorganic insulating film 42, as in the fourth inorganic insulating film 44, also supplements the defects that may occur in the third inorganic insulating film 43 and the first inorganic insulating film 41, and blocks the development of the defects.

The predominate material of the second inorganic insulating film 42 may be silicon oxide, silicon oxynitride, silicon nitride, or aluminum oxide. The predominate material, which is such a material, may be used as an etching stopper layer. It is also possible, when the predominate material is such a material, to obtain the same effect as in the fourth inorganic insulating film 44. In addition, among these materials, the aluminum oxide is particularly preferred. It is possible, when the predominate material is the aluminum oxide, to most properly exert a function as the etching stopper layer.

The second inorganic insulating film 42 is formed by an ALD method using a low-temperature plasma, for example. It is possible, when the method for forming the second inorganic insulating film 42 is such a method, to increase the density of the second inorganic insulating film 42 compared to when the second inorganic insulating film 42 is formed by a CVD method. This makes it possible to enhance the function as the etching stopper layer. The use of the ALD method using a low-temperature plasma also makes it possible to obtain the same effect as in the fourth inorganic insulating film 44.

A thickness D2 of the second inorganic insulating film 42 may range from 50 nm to 200 nm, may preferably range from 30 nm to 180 nm, and may more preferably range 50 nm to 150 nm. It is possible, when the thickness D2 is within such a range, to cause the second inorganic insulating film 42 to properly function as an etching stopper layer in various etching methods, compared to when the thickness D2 is out of such a range. It is also possible, when the thickness D2 is within the range described above, to obtain the same effect as in the fourth inorganic insulating film 44.

The first inorganic insulating film 41 is disposed between the light-emitting element 20 and the color filter 6. The first inorganic insulating film 41 includes the plurality of the lens surfaces 411 having the function of collecting light. The first inorganic insulating film 41 includes a plurality of convex portions, and a contact surface of the convex portion with the resin layer 5 is the lens surface 411. The plurality of the lens surfaces 411 are arranged in a one-to-one manner with respect to the plurality of the light-emitting elements 20. Each of the lens surfaces 411 protrudes from the fourth inorganic insulating film 44 toward the color filter 6. In other words, each of the lens surfaces 411 has a curved shape protruding to the side of the color filter 6. Also, in the illustrated example, the lens surfaces 411 are separated from one another.

The predominate material of the first inorganic insulating film 41 may be silicon nitride or silicon oxynitride. It is possible, when the predominate material of the first inorganic insulating film 41 is silicon nitride or silicon oxynitride, to exert superior lens performance in a relationship with the refractive index of the resin layer 5 described later compared to when the predominate material is silicon oxide, for example. Here, when the predominate material of the first inorganic insulating film 41 is silicon nitride or silicon oxynitride, the refractive index, in visible light having a wavelength of 550 nm, of the first inorganic insulating film 41 ranges from 1.8 to 1.9, for example. It is also possible, when the predominate material of the first inorganic insulating film 41 is silicon nitride or silicon oxynitride, to obtain the same effect as in the fifth inorganic insulating film 45.

The first inorganic insulating film 41 is formed by a CVD method using a low-temperature plasma, for example. It is possible, by forming the first inorganic insulating film 41 by the CVD method, to easily form the first inorganic insulating film 41 having the thickness D1 necessary to form the lens surface 411 having a desired curvature. The use of plasma also makes it possible to form the film at a lower temperature such as not higher than 100° C. compared to when the plasma is not used, and to reduce the stress of the first inorganic insulating film 41 by adjusting an amount of gas. This makes it possible to suppress a risk of occurrence of cracks and the like in the sealing layer 4. This thus suppresses the risk of occurrence of defects such as cracks and the like in the sealing layer 4.

A thickness D1 of the first inorganic insulating film 41 may range from 400 nm to 2000 nm, may preferably range from 450 nm to 1900 nm, and may more preferably range from 500 nm to 1800 nm. When the thickness D1 is within such a range, the lens surface 411 with a desired curvature is easily formed compared to when the thickness D1 is out of such a range. It is also possible, when the thickness D1 is within the range described above, to obtain the same effect as in the fifth inorganic insulating film 45.

The resin layer 5 is disposed between the first inorganic insulating film 41 and the color filter 6, and is in contact with these members. The resin layer 5 covers the plurality of the lens surfaces 411. The resin layer 5 has a plurality of concave portions. The plurality of the concave portions are arranged in a one-to-one manner on the plurality of the lens surfaces 411.

The constituent material of the resin layer 5 is a resin material such as an acrylic photosensitive resin material, for example. The resin layer 5 has the refractive index smaller than the refractive index of the first inorganic insulating film 41. Accordingly, the light emitted from the light-emitting portion 2 is collected by the lens surface 411. The refractive index, in visible light having a wavelength of 550 nm, of the resin layer 5 ranges from 1.4 to 1.5, for example.

The thickness of the resin layer 5 may be any thickness as long as the resin layer 5 covers the first inorganic insulating film 41. Thus, in the first embodiment, the thickness of the thickest portion of the resin layer 5 is greater than the thickness D1 of the first inorganic insulating film 41.

The color filter 6 is disposed on the resin layer 5. The color filter 6 is in contact with the resin layer 5. The element substrate 1 is an on-chip color filter (OCCF).

The color filter 6 selectively transmits light in a predetermined wavelength range. The predetermined wavelength range includes a peak wavelength λ0 determined depending on the optical distance L0 described above. It is possible, by including the color filter 6, to enhance color purity of light emitted from each of the subpixels P0 compared to when the color filter 6 is not included. The color filter 6 is formed of a resin material such as an acrylic photosensitive resin material containing a color material, for example. The constituent materials of the color filters 6 may be the same material in view of ease of manufacturing, except for containing the color material. Note that the color material is a pigment or dye.

The color filter 6 includes a colored layer 61R provided corresponding to the subpixel PR, a colored layer 61G provided corresponding to the subpixel PG, and a colored layer 61B provided corresponding to the subpixel PB. A colored layer 61 is provided for each of the subpixels P0. The colored layer 61R selectively transmits light in the red wavelength range of light from the light-emitting element 20R. The colored layer 61G selectively transmits light in the green wavelength range of light from the light-emitting element 20G. The colored layer 61B selectively transmits light in the blue wavelength range of light from the light-emitting element 20B.

The light-transmissive substrate 7 is jointed to the element substrate 1 described above via an adhesive layer 70. The adhesive layer 70 is a transparent adhesive using a resin material such as epoxy resin and acrylic resin, for example.

Figure 4:
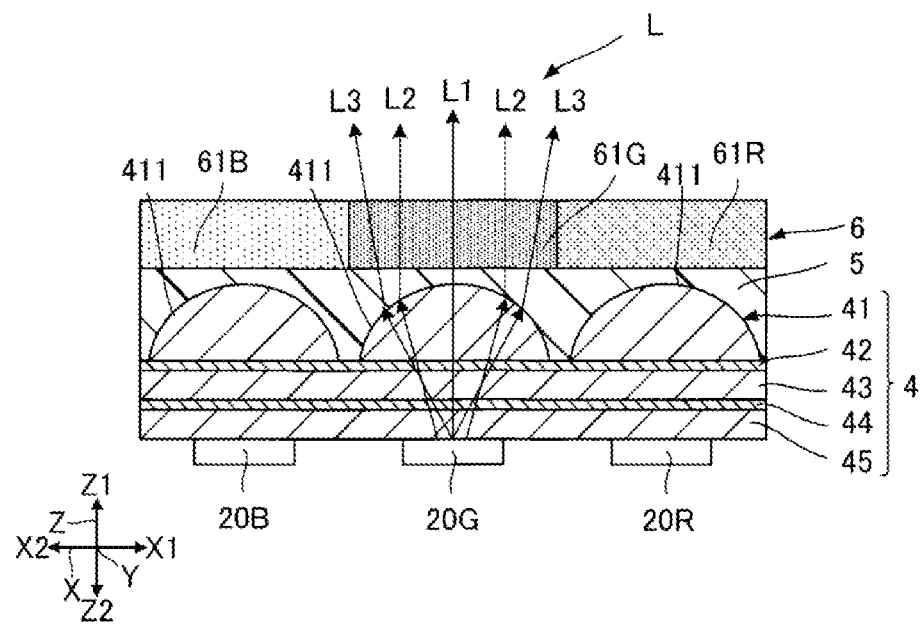
FIG. 4 is an explanatory view of light transmitted through a lens illustrated in FIG. 3.

FIG. 4 is an explanatory view of light transmitted through the lens surface 411 illustrated in FIG. 3. As illustrated in FIG. 4, light L1, of the light L, passing through the center of the lens surface 411 and parallel to the vertical direction of the substrate 10 directly passes straight through the lens surface 411 to be incident on the resin layer 5. Then, the light L1 directly advances straight to be incident on the colored layer 61 corresponding to the lens surface 411. In addition, light L2, of the light L, advancing obliquely with respect to the vertical direction of the substrate 10 is refracted by the lens surface 411, and is then incident on the resin layer 5 in a state where the light L2 is being collected toward the vertical direction of the substrate 10. The light L2 is then incident on the colored layer 61 corresponding to the lens surface 411. Further, light L3, of the light L, advancing obliquely with respect to the vertical direction of the substrate 10 is refracted by the lens surface 411, and is then incident on the resin layer 5 in a state where the light L3 is being collected toward the vertical direction of the substrate 10. The light L3 is then incident on the colored layer 61 corresponding to the lens surface 411.

As illustrated in FIG. 4, it is possible, by including the lens surface 411, to cause the light L2 and L3 inclined with respect to the optical axis to be incident on the colored layer 61 corresponding to the lens surface 411. Accordingly, it is possible, by providing the lens surface 411, to improve extraction efficiency of the light L compared to when the lens surface 411 is not provided.

Figure 5:
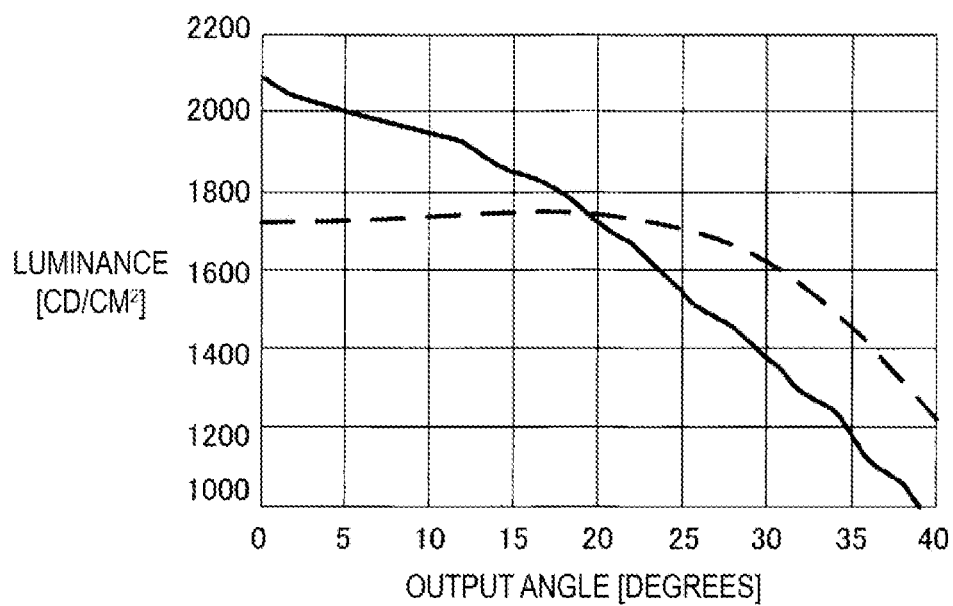
FIG. 5 is a graph indicating a relationship between an output angle and a luminance of light.

FIG. 5 is a graph indicating the relationship between an output angle and a luminance of light. The dashed line illustrated in FIG. 5 indicates when the lens surface 411 is not provided, while the solid line indicates when the lens surface 411 is provided. As illustrated in FIG. 5, it can be recognized, by providing the lens surface 411, that the luminance is increased in a range from 0 degree to 18 degrees compared to when the lens surface 411 is not provided. Specifically, when the output angle is 0 degree, the luminance, by providing the lens surface 411, becomes approximately 1.2 times greater than when the lens surface 411 is not provided. This makes it possible, when the electro-optical device 100 is used in a head-mounted display described layer, to improve the brightness and display quality of the head-mounted display, for example.

As described above, the electro-optical device 100 includes the first inorganic insulating film 41 including the lens surface 411 having a curved shape. The lens surface 411 has a curved shape protruding to the side of the colored layer 61 corresponding to the lens surface 411. The electro-optical device 100 also includes the resin layer 5 being in contact with the lens surface 411. Further, the resin layer 5 has the refractive index smaller than the refractive index of the first inorganic insulating film 41. This makes it possible to improve the light extraction efficiency compared to when the first inorganic insulating film 41 is not included, as described above.

Moreover, because the lens surface 411 has a curved shape protruding to the side of the colored layer 61, it is possible to simply form the lens surface 411 by dry etching, for example. Note that an example of a manufacturing method for the lens surface 411 will be described later.

It is also possible, when the first inorganic insulating film 41 and the colored layer 61 are arranged in this order, to enhance the color purity of each color compared to when the colored layer 61 and the first inorganic insulating film 41 are arranged in this order. Moreover, the lens surfaces 411 are separated from one another, as described above. Accordingly, a part of the second inorganic insulating film 42 is exposed between mutually adjacent lens surfaces 411 in plan view. Thus, the first inorganic insulating film 41 and a part of the second inorganic insulating film 42 are in contact with the resin layer 5. It is possible, when the plurality of the lens surfaces 411 are separated from one another, to reduce the ratio of a plane area of the lens surface 411 to a plane area of a colored layer 61 compared to when the plurality of the lens surfaces 411 are in contact with one another. Accordingly, light transmitted through the lens surface 411 is easily made incident on the colored layer 61 corresponding to the lens surface 411. This makes it possible to enhance the color purity and intensity of light of each color.

As described above, the electro-optical device 100 also includes the second inorganic insulating film 42. The second inorganic insulating film 42 is disposed, between the light-emitting element 20 and the first inorganic insulating film 41, so as to be in contact with the first inorganic insulating film 41. Further, the second inorganic insulating film 42 has an etching rate lower than the etching rate of the first inorganic insulating film 41. This causes the second inorganic insulating film 42 to function as an etching stopper layer. This makes it possible to form the first inorganic insulating film 41 including the lens surface 411 by etching on the second inorganic insulating film 42. Thus, as in the related art, the lens surface 411 can be formed at a part of the light-emitting element 20 without providing a convex portion. Accordingly, the convex portion becomes nuclei, and which prevents a risk of occurrence of sealing defects in the first inorganic insulating film 41 and other insulating films. Thus, according to the electro-optical device 100, it is possible to achieve both superior sealing performance and improved light extraction efficiency due to the lens function of the lens surface 411.

In addition, the first inorganic insulating film 41 may contain silicon nitride or silicon oxynitride, and the second inorganic insulating film 42 may contain silicon oxide, silicon oxynitride, silicon nitride, or aluminum oxide, as described above. Among these compounds, it is particularly preferred that the first inorganic insulating film 41 contain silicon nitride and the second inorganic insulating film 42 contain aluminum oxide. The aluminum oxide has a lower etching rate to fluorine-based etchant than silicon nitride, for example. Accordingly, when the first inorganic insulating film 41 contains silicon nitride and the second inorganic insulating film 42 contains aluminum oxide, the second inorganic insulating film 42 may be used as an etching stopper layer in various etching methods compared to when the first inorganic insulating film 41 or the second inorganic insulating film 42 is another material.

Moreover, it is possible, when the first inorganic insulating film 41 is silicon nitride, to increase a difference in the refractive indices between the first inorganic insulating film 41 and the resin layer 5 compared to when the first inorganic insulating film 41 is silicon oxynitride. This makes it possible to further improve the light extraction efficiency. Moreover, it is possible, when the first inorganic insulating film 41 is silicon nitride, to simply obtain, by a CVD method, the first inorganic insulating film 41 having the thickness D1 necessary to form the lens surface 411 having a desired curvature.

In addition, when the first inorganic insulating film 41 contains silicon nitride or silicon oxynitride and the second inorganic insulating film 42 contains silicon oxide, silicon oxynitride, silicon nitride, or aluminum oxide, the film density of the second inorganic insulating film 42 may be greater than the film density of the first inorganic insulating film 41. This makes it possible to cause the second inorganic insulating film 42 to properly function as an etching stopper layer. Further, the second inorganic insulating film 42 may be formed by an ALD method, and the first inorganic insulating film 41 may be formed by a CVD method. This makes it possible, even when the second inorganic insulating film 42 contains the same material contained in the first inorganic insulating film 41, to cause the film density of the second inorganic insulating film 42 to be greater than the film density of the first inorganic insulating film 41. This makes it possible, even when the second inorganic insulating film 42 contains the same material contained in the first inorganic insulating film 41, to cause the etching rate of the second inorganic insulating film 42 to be less than the etching rate of the first inorganic insulating film 41.

The electro-optical device 100 also includes the third inorganic insulating film 43, as described above. This makes it possible to enhance the sealing performance compared to when the third inorganic insulating film 43 is not included. Moreover, the electro-optical device 100 includes the fourth inorganic insulating film 44 and the fifth inorganic insulating film 45, as described above. This makes it possible to enhance the sealing performance compared to when the fourth inorganic insulating film 44 and the fifth inorganic insulating film 45 are not included.

The density of each of the fourth inorganic insulating films 44 and the second inorganic insulating film 42 is higher than the density of each of the fifth inorganic insulating films 45, the third inorganic insulating film 43, and the first inorganic insulating film 41. That is, each of the fourth inorganic insulating films 44 and the second inorganic insulating film 42 is a high density film, and each of the fifth inorganic insulating films 45, the third inorganic insulating film 43, and the first inorganic insulating film 41 is a low density film. The sealing layer 4, which includes a low density film, effectively mitigates the unevenness on the upper surface of the light-emitting portion 2. In contrast, the sealing layer 4, which includes a high density film, can suppress the development of defects in the sealing layer 4. The sealing layer 4 also includes two pairs of the low density film and high density film. This makes it possible to enhance the sealing performance of the sealing layer 4 compared to when one pair is included.

Each of the third inorganic insulating film 43 and the fifth inorganic insulating film 45 may contain silicon nitride, and the fourth inorganic insulating film 44 may contain aluminum oxide. That is, the sealing layer 4 may include a layered body in which layers of silicon nitride and layers of aluminum oxide are alternately layered. This particularly effectively blocks the development of defects, and can obtain the sealing layer 4 in which the unevenness on the light-emitting portion 2 is particularly mitigated.

Also, the thickness D5 may be greater than the thickness D3. The fifth inorganic insulating film 45, which is a layer being in contact with the light-emitting portion 2, is most susceptible to an effect of the unevenness on the surface of the light-emitting portion 2 compared to other films. Accordingly, it is possible, when the thickness D5 is greater than the thickness D3, to effectively mitigate the unevenness on the surface of the light-emitting portion 2. It is also possible, when the thickness D3 is less than the thickness D5, to suppress the entire thickness of the sealing layer 4 from becoming excessively thick. Note that the thickness D3 may be not less than the thickness D5.

The thickness D1 is greater than the thickness D3. This causes the lens surface 411 having a desired curvature is to be easily formed compared to when the thickness D1 is less than the thickness D3. It is also possible, when the thickness D3 is less than the thickness D1, to suppress the total film thickness of the sealing layer 4 from becoming excessively thick. Note that the thickness D1 may be less than the thickness D3 or may be equal to the thickness D3. Also, in the first embodiment, the thickness D1 is greater than the thickness D5. Thus, the thickness D1, thickness D3, and thickness D5 satisfy the relationship of D5<D3<D1. This makes it possible to mitigate the unevenness of the light-emitting portion 2 while suppressing the total film thickness of the sealing layer 4 from becoming excessively thick, and to easily form the lens surface 411 having a desired curvature. Note that the thickness D5 may be greater than the thickness D1 or may be equal to the thickness D1.

The total film thickness of the sealing layer 4 is not particularly limited, but may range from 500 nm to 2000 nm, may preferably range from 600 nm to 1800 nm, and may more preferably range from 700 nm to 1500 nm. It is possible, when the total film thickness is within such a range, to materialize the sealing layer 4 having excellent sealing performance and including the lens surface 411. Specifically, it is possible, when the electro-optical device 100 is of top-emission type and the total film thickness of the sealing layer 4 ranges not greater than 1500 nm, to preferably use the electro-optical device 100 as a micro display. Note that the total film thickness is an average thickness. Also, each of the thicknesses D1 to D5 described above is the average thickness.

In addition, on the first inorganic insulating film 41, a layer composed of an inorganic material may be disposed in place of the resin layer 5. However, the resin layer 5 composed of a resin material may be disposed on the first inorganic insulating film 41. It is possible, when the resin layer 5 is disposed on the first inorganic insulating film 41, to increase a difference in the refractive indices between the first inorganic insulating film 41 and a layer on the first inorganic insulating film 41 compared to when a layer composed of an inorganic material is disposed. This makes it possible to enhance the light extraction efficiency by the lens surface 411. Moreover, it is possible, when the layer is the resin layer 5, to directly dispose the color filter 6 on the resin layer 5. That is, the resin layer 5 functions as an adhesive layer for bringing the color filter 6 into contact with the sealing layer 4. When a layer composed of an inorganic material is disposed on the first inorganic insulating film 41, an adhesive layer needs to be separately disposed on the layer.

Also, the surface of the resin layer 5, which is opposite to the surface of the resin layer 5 that is in contact with the first inorganic insulating film 41, is a flat surface. Further, the flat surface is in contact with the color filter 6. It is easy, when the surface of the resin layer 5 is a flat surface, to directly dispose the color filter 6 on the resin layer 5. This makes it possible to materialize an on-chip color filter (OCCF). As a result, the electro-optical device 100 is made thin.

It is also possible, when the first inorganic insulating film 41, the resin layer 5, and the color filter 6 are layered, to decrease the distance between the lens surface 411 and the colored layer 61 compared to when another layer is interposed between two of these layers. Accordingly, this suppresses light emitted from the light-emitting element 20G corresponding to the subpixel PG of green color from entering the colored layer 61B of blue color being different from the color of the colored layer 61G corresponding to the light-emitting element 20G, for example. This suppresses the colored layer 61B from blocking the light emitted from the light-emitting element 20G.

1A-3. Manufacturing Method for Electro-Optical Device 100

Figure 6:
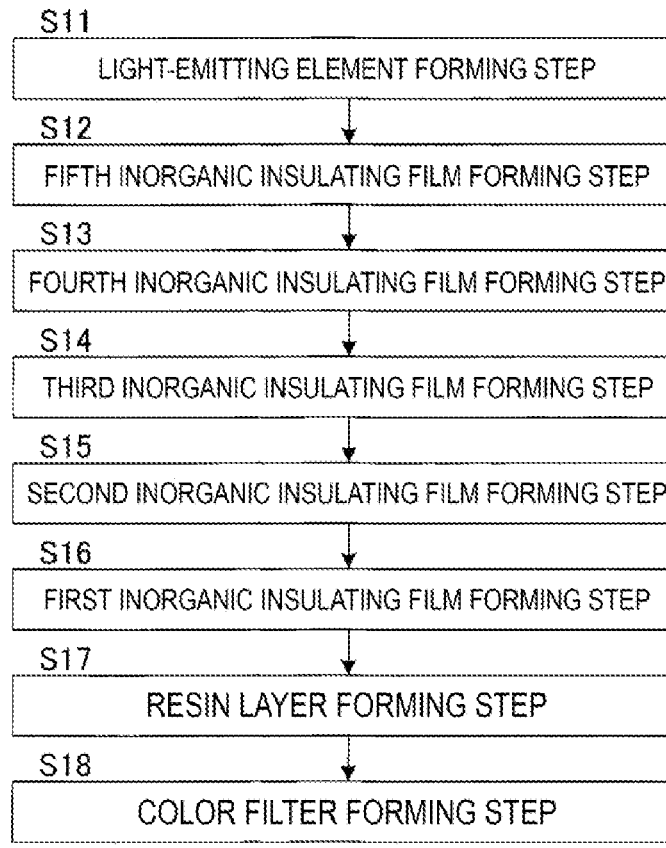
FIG. 6 is a flow of a manufacturing method for an electro-optical device of the first embodiment.

FIG. 6 is a flow of a manufacturing method for the electro-optical device 100 of the first embodiment. In the following, a manufacturing method for the element substrate 1 included in the electro-optical device 100 will be described. As illustrated in FIG. 6, the manufacturing method for the element substrate 1 included in the electro-optical device 100 includes a light-emitting element forming step S11, a fifth inorganic insulating film forming step S12, a fourth inorganic insulating film forming step S13, a third inorganic insulating film forming step S14, a second inorganic insulating film forming step S15, a first inorganic insulating film forming step S16, a resin layer forming step S17, and a color filter forming step S18.

Although not illustrated in detail, in the light-emitting element forming step S11, the light-emitting element 20 is formed. Specifically, the substrate 10, the reflective layer 26, the insulating layer 21, the optical path adjustment layer 22, the element isolation layer 220, the pixel electrode 23, the plurality of the organic layers 24, and the common electrode 25 are formed. The light-emitting element 20 is manufactured by a publicly known technology. The reflective layer 26 is formed by forming a metal film by a sputtering method or a vapor deposition method, and by patterning the metal film by a photolithography method, for example. The insulating layer 21 and the optical path adjustment layer 22 are formed by a CVD method and an etching method, for example. In addition, the plurality of the pixel electrodes 23 are formed by the same method as the method for forming the reflective layer 26 described above, for example. Each of the layers included in the organic layer 24 is formed by a vapor deposition method, for example. As in the organic layer 24, the common electrode 25 is formed by a vapor deposition method, for example.

Although not illustrated in detail, in the fifth inorganic insulating film forming step S12, the fifth inorganic insulating film 45 is formed on the light-emitting portion 2 by a CVD method using a low-temperature plasma. In addition, in the fourth inorganic insulating film forming step S13, the fourth inorganic insulating film 44 is formed on the fifth inorganic insulating film 45 by an ALD method using a low-temperature plasma. Further, in the third inorganic insulating film forming step S14, the third inorganic insulating film 43 is formed on the fourth inorganic insulating film 44 by a CVD method using a low-temperature plasma. Further, in the second inorganic insulating film forming step S15, the second inorganic insulating film 42 is formed on the third inorganic insulating film 43 by an ALD method using a low-temperature plasma.

Figure 7:
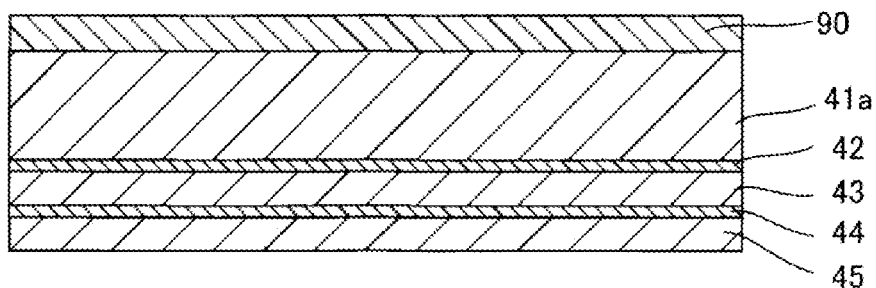
FIG. 7 is an explanatory view of a first inorganic insulating film forming step.
Figure 7:
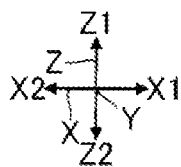

FIGS. 7, 8, 9, and 10 are each an explanatory view of the first inorganic insulating film forming step S16. In the first inorganic insulating film forming step S16, the first inorganic insulating film 41 including the plurality of the lens surfaces 411 is formed by a CVD method and etching method. First, an insulating film 41a is formed on the second inorganic insulating film 42 by a CVD method using a low-temperature plasma, as illustrated in FIG. 7. The thickness of the insulating film 41a is set in accordance with the thickness of the first inorganic insulating film 41 that is targeted. Next, a photoresist film 90 of positive type is formed on the insulating film 41a so as to cover the insulating film 41a, as illustrated in FIG. 7.

Figure 8:
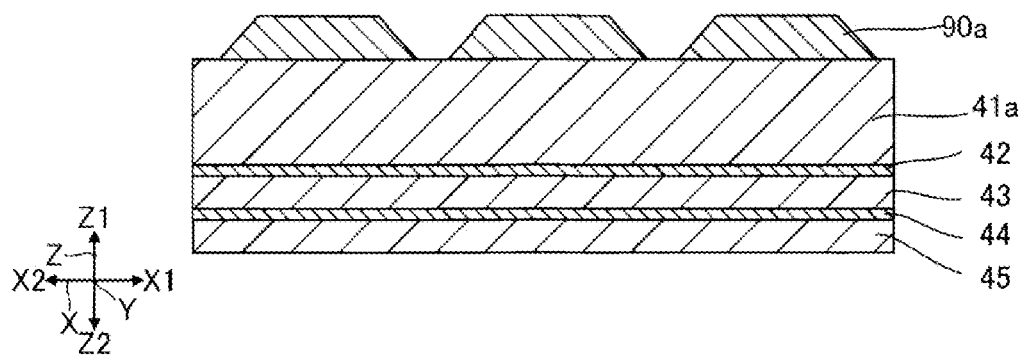
FIG. 8 is an explanatory view of a first inorganic insulating film forming step.

Next, the photoresist film 90 is exposed using a gray stone mask or half stone mask and is subject to reflow heating, to thus form a resist film 90a, as illustrated in FIG. 8. The exposure forms the resist film 90a including a plurality of portions corresponding to the plurality of the lens surfaces 411 that are targeted. By the reflow heating, the end portions of each of the plurality of the portions included in the resist film 90a are tapered.

Figure 9:
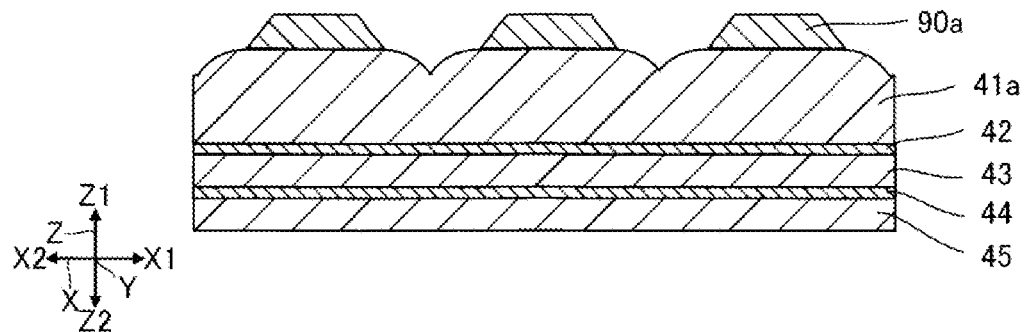
FIG. 9 is an explanatory view of a first inorganic insulating film forming step.

Next, the insulating film 41a is processed by dry etching using fluorine-based etching gas such as methane tetrafluoride ($CF_4$), as illustrated in FIG. 9. At this time, a part of the resist film 90a is scraped together with the insulating film 41a.

Figure 10:
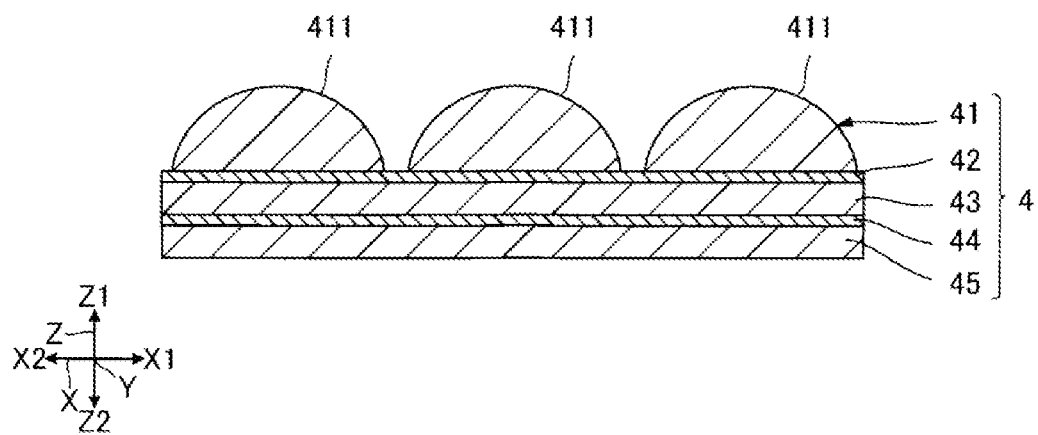
FIG. 10 is an explanatory view of a first inorganic insulating film forming step.

The insulating film 41a is then processed into a hemispherical shape by dry etching until the resist film 90a is eliminated. As a result, the first inorganic insulating film 41 including the plurality of the lens surfaces 411 is formed, as illustrated in FIG. 10. At this time, the second inorganic insulating film 42 being present in the lower layer of the insulating film 41a functions as an etching stopper layer. This makes it possible to prevent, in the dry etching of the insulating film 41a, the occurrence of over-etching of an insulating film in the lower layer of the second inorganic insulating film 42. In addition, according to the method described above, the plurality of the lens surfaces 411 are separated from one another, and the second inorganic insulating film 42 is exposed between the lens surfaces 411 that are adjacent to each other in plan view.

Figure 11:
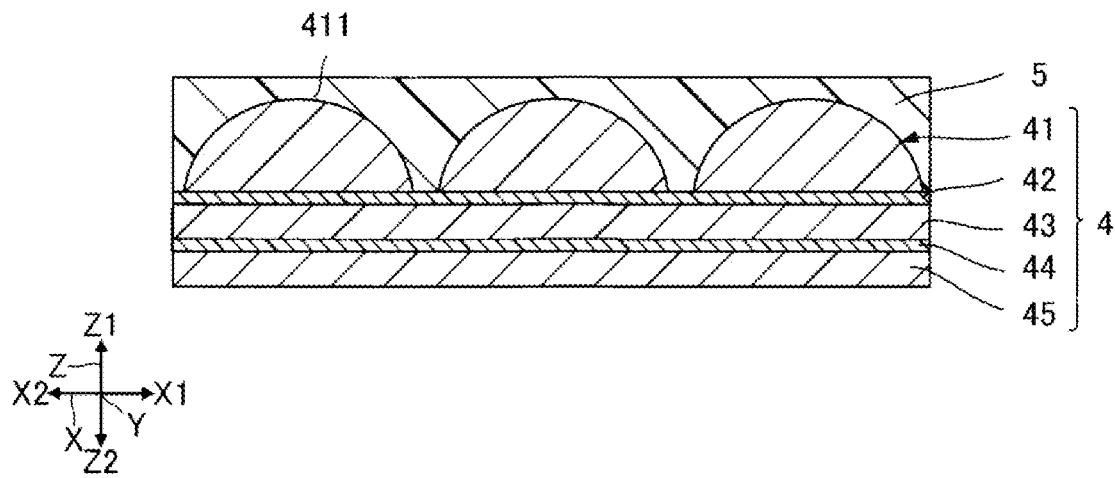
FIG. 11 is an explanatory view of a resin layer forming step.

FIG. 11 is an explanatory view of a resin layer forming step S17. In the resin layer forming step S17, the resin layer 5 is formed so as to be in contact with the first inorganic insulating film 41 and the part of the second inorganic insulating film 42 and so as to cover the first inorganic insulating film 41, as illustrated in FIG. 11. The resin layer 5 is formed by applying an acrylic photosensitive resin by a spin coating method or the like and by curing the coating film, for example. The upper surface of the resin layer 5 is planarized when the first inorganic insulating film 41 is covered by the resin layer 5.

Figure 12:
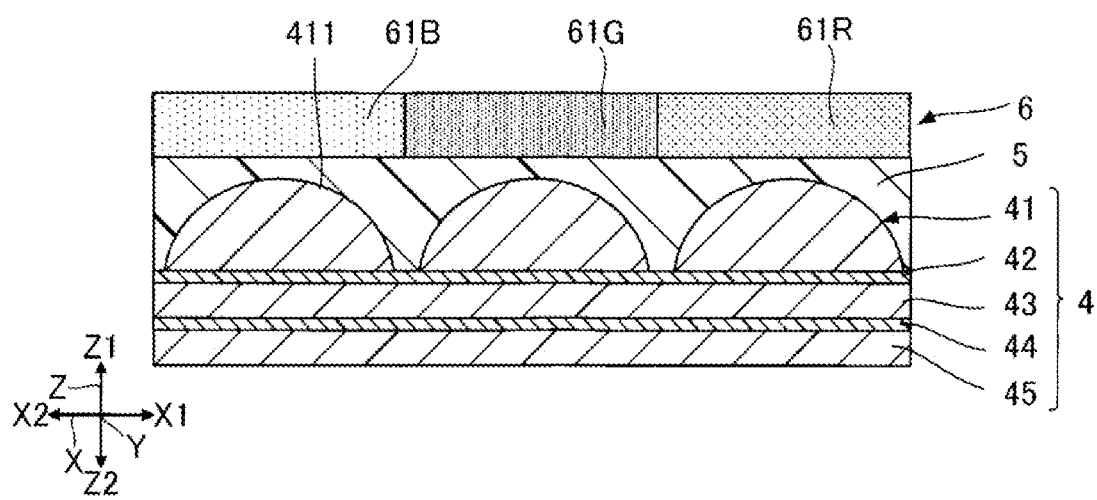
FIG. 12 is an explanatory view of a color filter forming step.

FIG. 12 is an explanatory view of the color filter forming step S18. In the color filter forming step S18, the color filter 6 is formed on the resin layer 5, as illustrated in FIG. 12. Although not illustrated in detail, specifically, first, a colored resin layer is formed by applying a photosensitive resin containing a green color material onto the resin layer 5 by a spin coating method and drying the coating film. Subsequently, the colored resin layer is exposed, whereby the unexposed portion of the colored resin layer is removed by an alkaline developer or the like. Thereafter, the colored resin layer is cured to form the colored layer 61G. Next, as in the formation of the colored layer 61G, the colored layer 61B is formed, and then the colored layer 61R is formed. As a result, the color filter 6 is obtained, as illustrated in FIG. 12. Note that the formation order of the colored layers 61G, 61B, and 61R is not limited to the above-described order.

Thus, the element substrate 1 is formed. Also, although not illustrated, a transparent resin material is applied onto the color filter 6, and then the light-transmissive substrate 7 constituted of a glass substrate and the like is disposed on the applied resin material, and pressed. At this time, when the resin material is a photosensitive resin, the photosensitive resin is irradiated with light through the light-transmissive substrate 7. As a result, the photosensitive resin is cured. By the curing, the adhesive layer 70 composed of a cured product of the resin material is obtained. In addition, the light-transmissive substrate 7 adheres to the color filter 6 by the adhesive layer 70.

Thus, the electro-optical device 100 is manufactured. According to the method described above, the electro-optical device 100 can be simply and rapidly formed. Further, according to the method described above, the sealing layer 4 including the lens surface 411 can be formed while suppressing the occurrence of sealing defects in the sealing layer 4 including the first inorganic insulating film 41.

1B. Second Embodiment

The second embodiment will be described. Note that, in the following exemplifications, a reference sign used in the description of the first embodiment is also used for the same component having the same function as in the first embodiment, and each detailed description thereof will be appropriately omitted.

Figure 13:
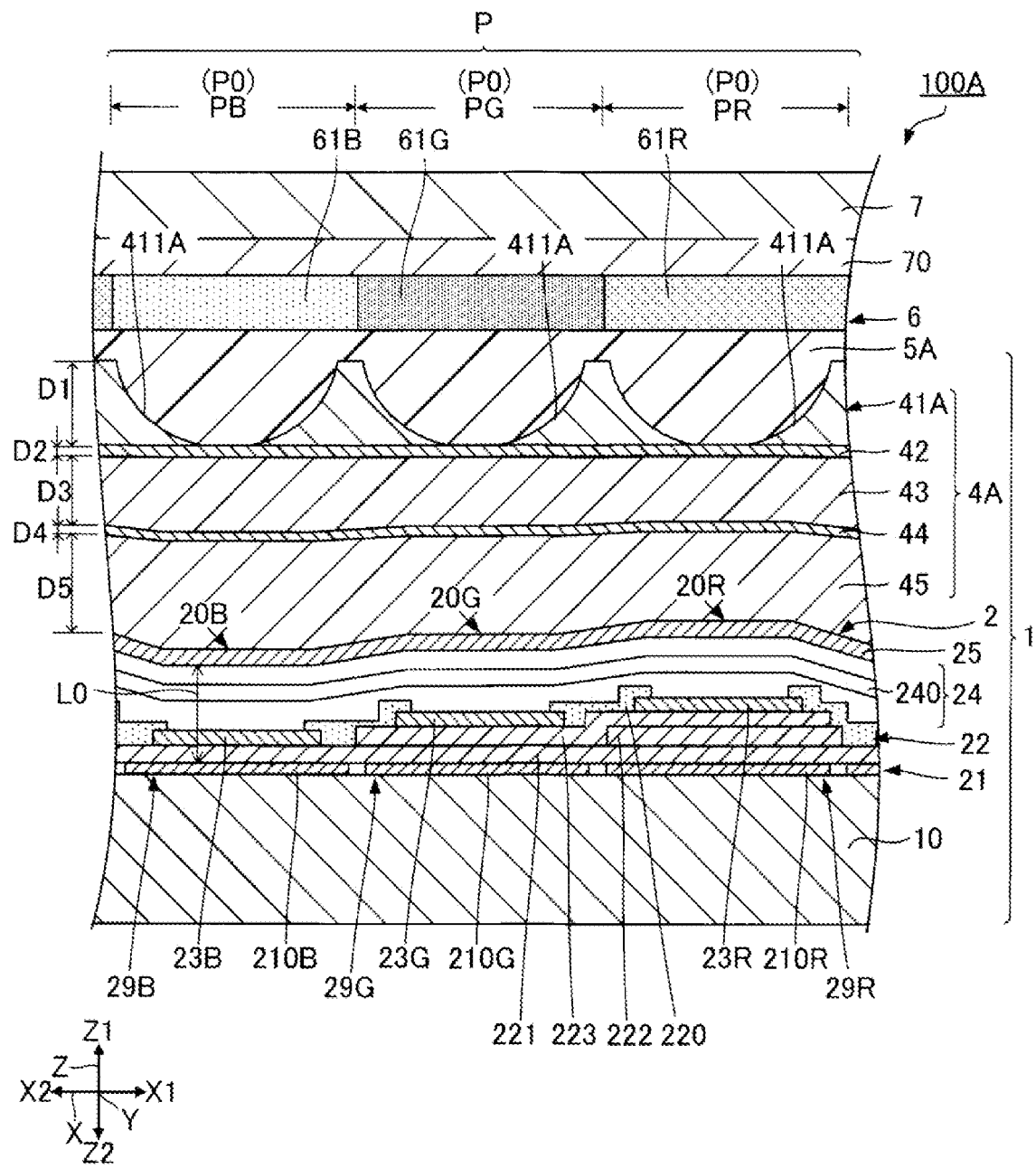
FIG. 13 is a cross-sectional view of an electro-optical device of the second embodiment.

FIG. 13 is a cross-sectional view of an electro-optical device 100A of the second embodiment. The electro-optical device 100A of the second embodiment includes a sealing layer 4A and a resin layer 5A in place of the sealing layer 4 and the resin layer 5 that are included in the electro-optical device 100 of the first embodiment. In the following, differences between the sealing layer 4A and the resin layer 5A and the sealing layer 4 and the resin layer 5 of the first embodiment will be described, where the same matters are omitted as appropriate.

The sealing layer 4A illustrated in FIG. 13 includes a first inorganic insulating film 41A. The first inorganic insulating film 41A includes a plurality of lens surfaces 411A for enhancing viewing angle characteristics of light. The first inorganic insulating film 41A includes a plurality of concave portions, and a contact surface of the concave portion with the resin layer 5A is the lens surface 411A. Each of the lens surfaces 411A diffuses light emitted from the light-emitting element 20. A plurality of the lens surfaces 411A are arranged in a one-to-one manner with respect to the plurality of the light-emitting elements 20. Each of the lens surfaces 411A protrudes from the color filter 6 toward the fourth inorganic insulating film 44. In other words, each of the lens surfaces 411A has a curved shape protruding to the side of the light-emitting element 20. Also, in the illustrated example, the lens surfaces 411A are separated from one another.

The resin layer 5A is disposed between the first inorganic insulating film 41A and the color filter 6, and is in contact with these members. The resin layer 5A covers the plurality of the lens surfaces 411A. The resin layer 5 includes the plurality of the convex portions. The plurality of the convex portions are arranged in a one-to-one manner on the plurality of the lens surfaces 411A.

Figure 14:
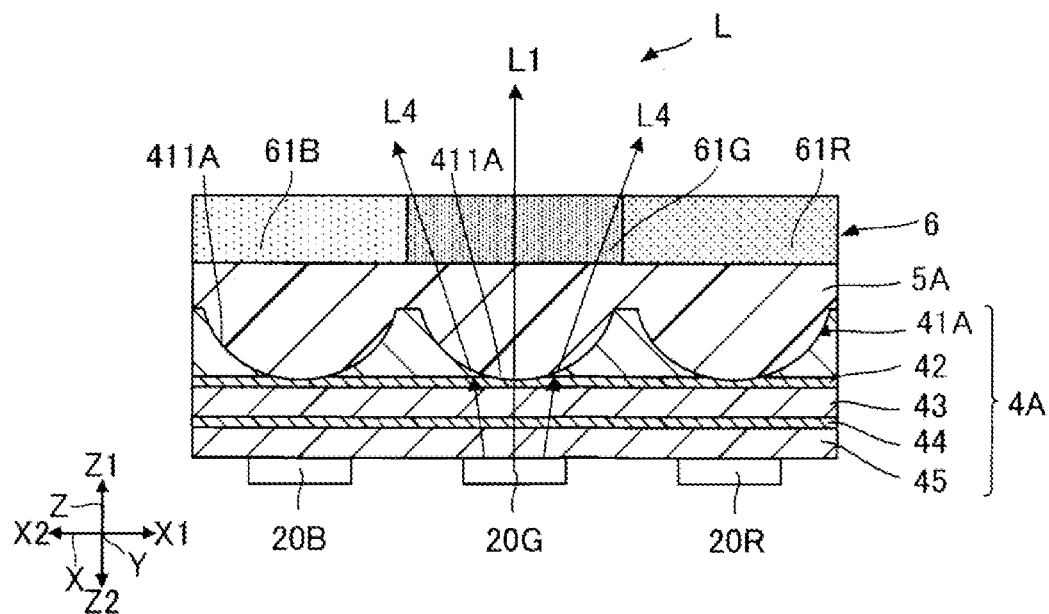
FIG. 14 is an explanatory view of light transmitted through a lens illustrated in FIG. 13.

FIG. 14 is an explanatory view of light transmitted through the lens surface 411A illustrated in FIG. 13. As illustrated in FIG. 14, light L1, of the light L, passing through the center of the lens surface 411 and parallel to the vertical direction of the substrate 10 directly passes straight through the lens surface 411A to be incident on the resin layer 5A. Then, the light L1 directly advances straight to be incident on the colored layer 61 corresponding to the lens surface 411A. In addition, light L4, of the light L, advancing obliquely with respect to the vertical direction of the substrate 10 is refracted by the lens surface 411, and is then incident on the resin layer 5A so as to go away from the vertical direction of the substrate 10 in a state where the light L4 is being inclined with respect to the vertical direction of the substrate 10. The light L4 is then incident on the colored layer 61 corresponding to the lens surface 411A.

As described above, the electro-optical device 100A includes the first inorganic insulating film 41A including the lens surface 411A having a curved shape. The lens surface 411A has a curved shape protruding to the side of the light-emitting element 20 corresponding to the lens surface 411A. The electro-optical device 100 also includes the resin layer 5A being in contact with the lens surface 411A. Further, the resin layer 5A has the refractive index smaller than the refractive index of the first inorganic insulating film 41. This makes it possible to improve the viewing angle characteristics compared to when the first inorganic insulating film 41A is not included, as described above. Thus, according to the electro-optical device 100A, it is possible to achieve both superior sealing performance and improved viewing angle characteristics due to the lens function of the lens surface 411A. Specifically, the electro-optical device 100 of the second embodiment, which has excellent divergence effect, may be used in a head-mounted display and the like described later, for example.

Moreover, because the lens surface 411A has a curved shape protruding to the side of the light-emitting element 20, it is possible to simply form the lens surface 411A by wet etching, for example. Note that an example of a manufacturing method for the lens surface 411A will be described later.

In addition, as in the first embodiment, the electro-optical device 100A includes the second inorganic insulating film 42. Further, the second inorganic insulating film 42 has an etching rate lower than the etching rate of the first inorganic insulating film 41A. This causes the second inorganic insulating film 42 to function as an etching stopper layer. This makes it possible to form the first inorganic insulating film 41A including the lens surface 411A by etching on the second inorganic insulating film 42. Thus, as in the related art, the lens surface 411A can be formed without providing a convex portion at a part of the light-emitting element 20. Accordingly, the convex portion becomes nuclei, and which prevents a risk of occurrence of sealing defects in the first inorganic insulating film 41A and other insulating films. Thus, according to the electro-optical device 100, it is possible to achieve both superior sealing performance and improved viewing angle characteristics due to the lens function of the lens surface 411.

Figure 15:
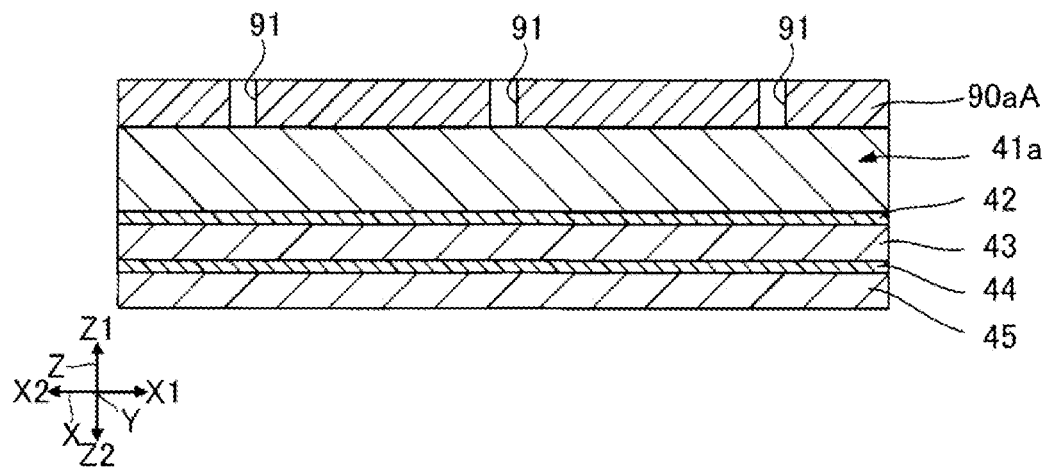
FIG. 15 is an explanatory view of the first inorganic insulating film forming step.

FIGS. 15, 16, 17, and 18 are each an explanatory view of the first inorganic insulating film forming step S16. First, a resist film 90aA including a plurality of holes 91 is formed by photolithography on the insulating film 41a formed by a low-temperature plasma CVD method, as illustrated in FIG. 15.

Figure 16:
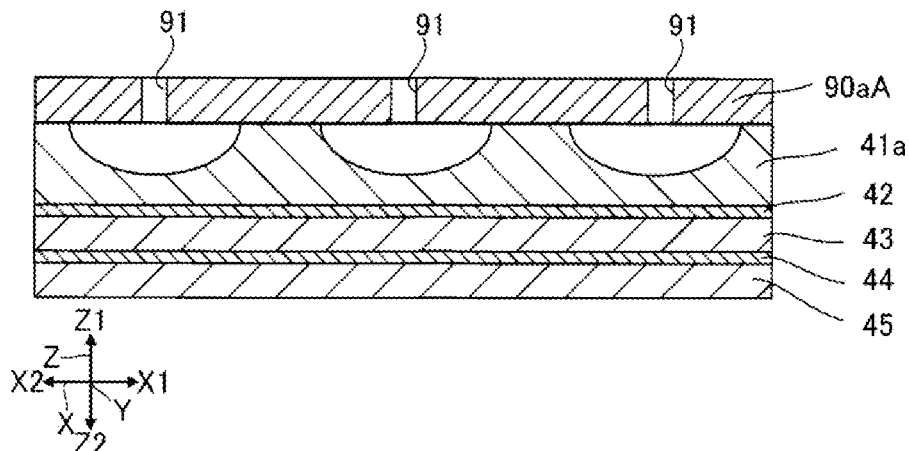
FIG. 16 is an explanatory view of the first inorganic insulating film forming step.
Figure 17:
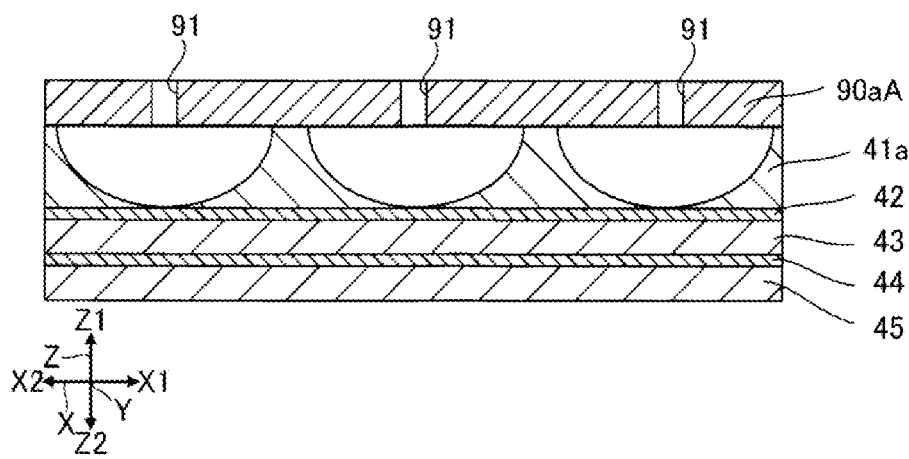
FIG. 17 is an explanatory view of the first inorganic insulating film forming step.
Figure 18:
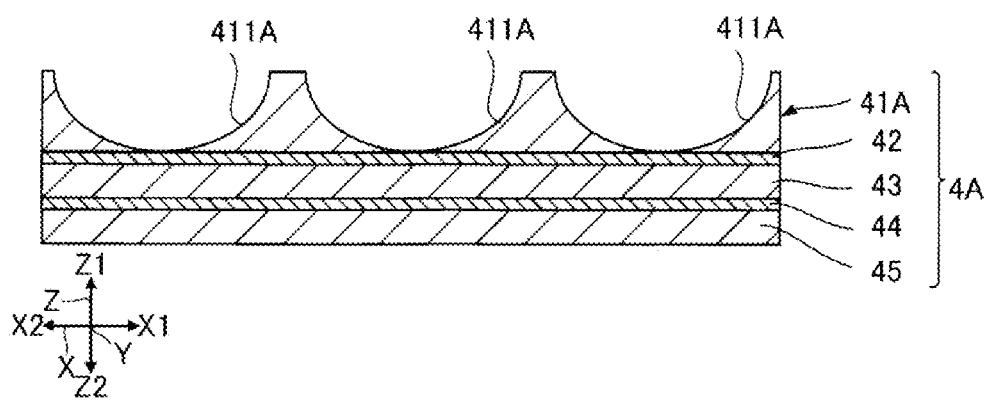
FIG. 18 is an explanatory view of the first inorganic insulating film forming step.

Next, the insulating film 41a is processed by wet etching using a fluorine-based etchant such as buffered hydrofluoric acid (BHF), as illustrated in FIG. 16. By performing isotropic etching by wet etching, a hemispherical concave portion is formed, as illustrated in FIG. 17. Thereafter, the resist film 90aA is removed, as illustrated in FIG. 18. As a result, the first inorganic insulating film 41A including the lens surface 411A is formed.

Here, when performing etching, the second inorganic insulating film 42 being present in the lower layer of the insulating film 41a functions as an etching stopper layer. As in the first embodiment, this makes it possible to prevent, in the wet etching of the insulating film 41a, the occurrence of over-etching of the insulating film in the lower layer of the second inorganic insulating film 42. In addition, according to the method described above, the plurality of the lens surfaces 411A are separated from one another, and the second inorganic insulating film 42 is exposed between the lens surfaces 411A that are adjacent to each other in plan view.

Figure 19:
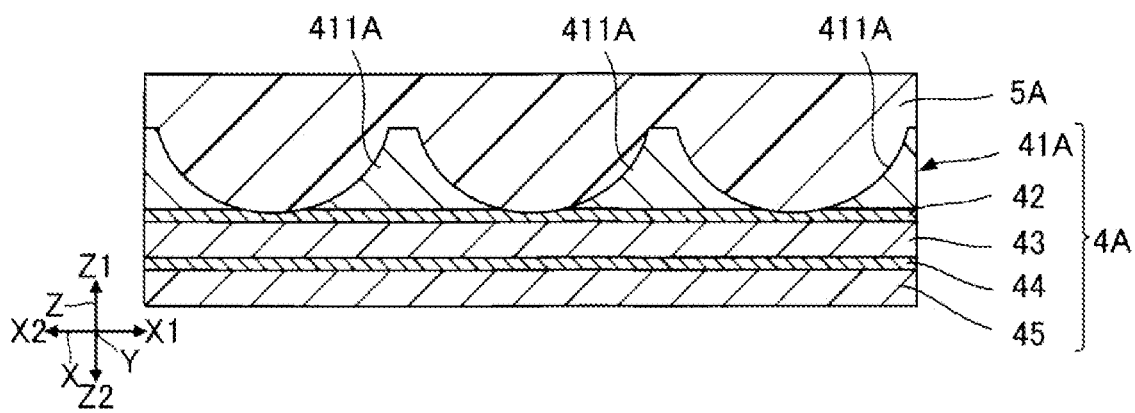
FIG. 19 is an explanatory view of a resin layer forming step.

FIG. 19 is an explanatory view of the resin layer forming step S17. In the resin layer forming step S17, the resin layer 5A is formed so as to be in contact with the first inorganic insulating film 41A and the part of the second inorganic insulating film 42 and to cover the first inorganic insulating film 41A, as illustrated in FIG. 19. The resin layer 5A is formed by applying an acrylic photosensitive resin by a spin coating method or the like, and by curing the coating film, for example. The upper surface of the resin layer 5A is planarized by covering the first inorganic insulating film 41A by the resin layer 5A.

Figure 20:
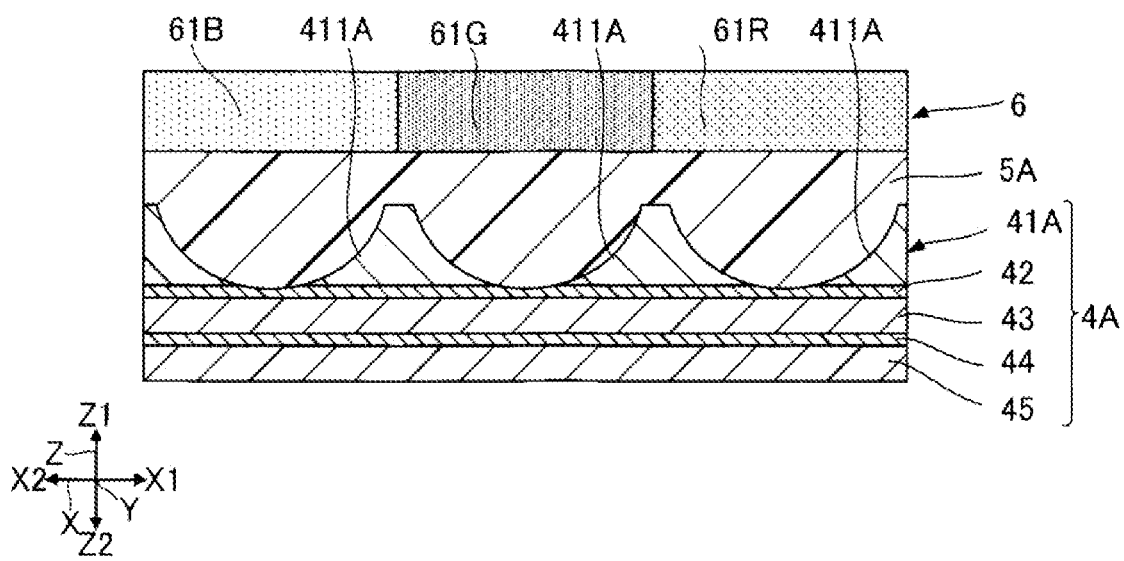
FIG. 20 is an explanatory view of a color filter forming step.

FIG. 20 is an explanatory view of the color filter forming step S18. In the color filter forming step S18, the color filter 6 is formed on the resin layer 5A, as illustrated in FIG. 20.

Thus, the element substrate 1 is formed. According to the method described above, the sealing layer 4A including the lens surface 411A can be formed while suppressing the occurrence of sealing defects in the sealing layer 4A including the first inorganic insulating film 41A.

1C. Modification Example

Each of the embodiments exemplified in the above can be variously modified. Specific modification aspects applicable to each of the embodiments described above are exemplified below. Two or more modes freely selected from exemplifications below can be appropriately used in combination as long as mutual contradiction does not arise. The contents of the first embodiment described below is also applicable to the second embodiment in a non-contradictory range.

In each of the embodiments, the light-emitting element 20 includes the optical resonance structure 29 having a different resonant wavelength for each color, but may not include the optical resonance structure 29. In addition, the electro-optical device 100 displays a full color image, but may also display a monochrome image. In this case, the electro-optical device 100 includes the light-emitting element 20 that emits any of the wavelength ranges of blue, green, and red colors, for example. The light-emitting element 20 may also include a different light-emitting material for each of the subpixels P0. The pixel electrode 23 may also have light reflectivity. In this case, the reflective layer 26 may be omitted. In addition, although the common electrode 25 is common in the plurality of the light-emitting elements 20, an individual cathode may be provided for each of the light-emitting elements 20.

In each of the embodiments, an array of the light-emitting regions A is, but not limited to, a stripe array, and may be a Bayer array, a delta array, or a rectangle array as well, for example.

In the first embodiment, the sealing layer 4 includes five insulating films, and it is sufficient for the sealing layer 4 to include at least the second inorganic insulating film 42 and the first inorganic insulating film 41. Thus, the third inorganic insulating film 43, the fourth inorganic insulating film 44, and the fifth inorganic insulating film 45 may be omitted. The sealing layer 4 may also include six or more insulating films.

In the first embodiment, the first inorganic insulating film 41 has the refractive index smaller than, but which may be greater than, the refractive index of the resin layer 5.

The "electro-optical device" is not limited to an organic EL device, and may be an inorganic EL device using an inorganic material or a μLED device.

2. Electronic Apparatus

The electro-optical devices 100 of the above-described embodiments are applicable to various electronic apparatuses.

2-1. Head-Mounted Display

Figure 21:
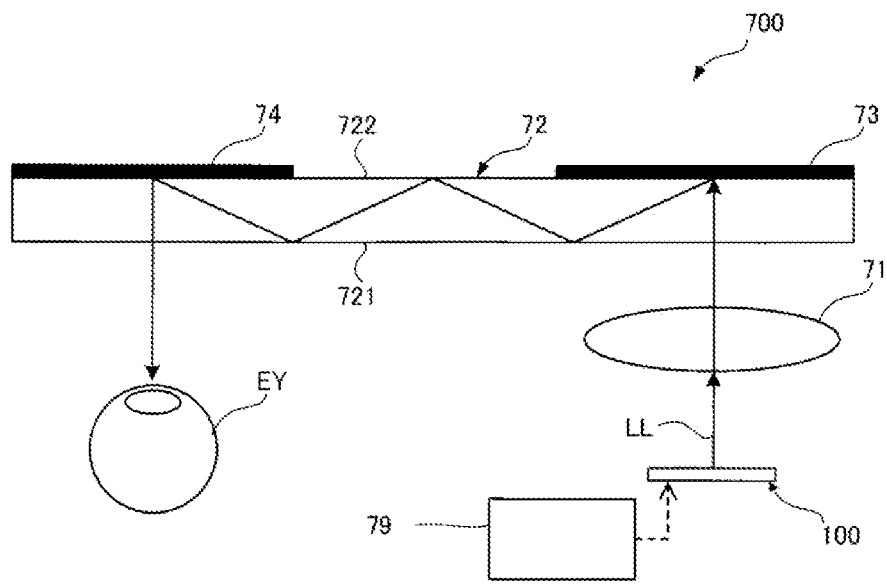
FIG. 21 is a plan view schematically illustrating a part of a virtual display apparatus as an example of an electronic apparatus.

FIG. 21 is a plan view schematically illustrating a part of a virtual display apparatus 700 as an example of an electronic apparatus. The virtual display apparatus 700 illustrated in FIG. 21 is a head-mounted display (HMD) mounted on a head of an observer and configured to display an image. The virtual display apparatus 700 includes the electro-optical device 100 described above, a collimator 71, a light guide body 72, a first reflection-type volume hologram 73, a second reflection-type volume hologram 74, and a control unit 79. Note that the light emitted from the electro-optical device 100 is emitted as image light LL.

The control unit 79 includes a processor and a memory, for example, to control an operation of the electro-optical device 100. The collimator 71 is disposed between the electro-optical device 100 and the light guide body 72. The collimator 71 collimates the light emitted from the electro-optical device 100. The collimator 71 is constituted of a collimator lens or the like. The light collimated by the collimator 71 is incident on the light guide body 72.

The light guide body 72 has a flat plate shape, and is disposed so as to extend in a direction intersecting the direction in which light is incident via the collimator 71. The light guide body 72 reflects and guides light thereinside. A light-incident port on which light is incident and a light-emission port through which light is emitted are provided in a surface 721, facing the collimator 71, of the light guide body 72. The first reflection-type volume hologram 73 as a diffractive optical element and the second reflection-type volume hologram 74 as a diffractive optical element are arranged on a surface 722, opposite to the surface 721, of the light guide body 72. The first reflection-type volume hologram 73 is provided closer to the light emission port side than the second reflection-type volume hologram 74. The first reflection-type volume hologram 73 and the second reflection-type volume hologram 74 include interference fringes corresponding to a predetermined wavelength range, and diffract and reflect light in the predetermined wavelength range.

In the virtual display apparatus 700 of such a configuration, the image light LL incident on the light guide body 72 through the light-incident port advances while being repeatedly reflected, and is guided through the light-incident port to an eye EY of the observer, whereby the observer can observe an image constituted of a virtual image formed by the image light LL.

The virtual display apparatus 700 includes the electro-optical device 100 described above. The electro-optical device 100 described above has excellent light extraction efficiency and is of high quality. This makes it possible, by including the electro-optical device 100, to provide the virtual display apparatus 700 of high-quality. Note that, in place of the electro-optical device 100, the electro-optical device 100A may be used as well.

2-2. Personal Computer

Figure 22:
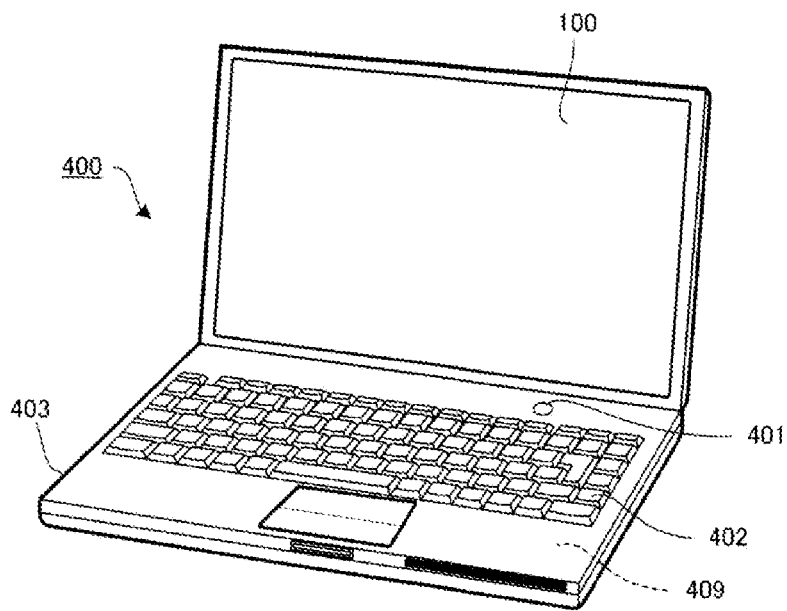
FIG. 22 is a perspective view of a personal computer as an example of an electronic apparatus.

FIG. 22 is a perspective view of a personal computer 400 as an example of an electronic apparatus of the present disclosure. The personal computer 400 illustrated in FIG. 22 includes the electro-optical device 100, a main body 403 provided with a power switch 401 and a keyboard 402, and a control unit 409. The control unit 409 includes a processor and a memory, for example, and controls an operation of the electro-optical device 100. In the personal computer 400, the electro-optical device 100 described above has excellent light extraction efficiency and is of high quality. This makes it possible, by including the electro-optical device 100, to provide the personal computer 400 of a high display quality. Note that, in place of the electro-optical device 100, the electro-optical device 100A may be used as well.

Also, examples of the "electronic apparatus" including the electro-optical device 100 include, in addition to the virtual display apparatus 700 exemplified in FIG. 21 and the personal computer 400 exemplified in FIG. 22, an apparatus disposed adjacent to eyes such as a digital scope, a digital binocular, a digital still camera, and a video camera. Further, the "electronic apparatus" including the electro-optical device 100 is applied as a mobile phone, a smartphone, a Personal Digital Assistant (PDA), a car navigation apparatus, and a vehicle-mounted display unit. Moreover, the "electronic apparatus" including the electro-optical device 100 is applied as an illumination for illuminating light.

The present disclosure is described above based on, but not limited to, the illustrated embodiments. In addition, each of the configurations of the sections of the present disclosure may be replaced with any configuration that exerts an equivalent function to the above-described embodiments, and to which any configuration may be added. Further, any configuration may be combined with one another in the above-described embodiments of the present disclosure.

What is claimed is:

1. An electro-optical device, comprising:
   a light-emitting element;
   a colored layer corresponding to the light-emitting element;
   a first inorganic insulating film disposed between the light-emitting element and the colored layer, the first inorganic insulating film including a lens surface having a curved shape, wherein the lens surface of the first inorganic insulating film has the curved shape protruding toward the light-emitting element;
   a second inorganic insulating film disposed between the light-emitting element and the first inorganic insulating film, the second inorganic insulating film being disposed in contact with the first inorganic insulating film;
   a third inorganic insulating film disposed between the light-emitting element and the second inorganic insulating film, the third inorganic insulating film being disposed in contact with the second inorganic insulating film; and
   a resin layer disposed between the first inorganic insulating film and the colored layer, the resin layer being in contact with the lens surface of the first inorganic insulating film, wherein
   the first inorganic insulating film is greater in thickness than the third inorganic insulating film, and
   an etching rate of the second inorganic insulating film is lower than an etching rate of the first inorganic insulating film.

2. The electro-optical device according to claim 1, wherein
   the first inorganic insulating film includes silicon nitride, and
   the second inorganic insulating film includes aluminum oxide.

3. The electro-optical device according to claim 1, wherein
   a refractive index of the resin layer is smaller than a refractive index of the first inorganic insulating film.

4. The electro-optical device according to claim 3, wherein
   a surface of the resin layer that is opposite to a surface of the resin layer in contact with the first inorganic insulating film, is a flat surface, and
   the flat surface is in contact with the colored layer.

5. The electro-optical device according to claim 1, further comprising:
   a fourth inorganic insulating film disposed between the light-emitting element and the third inorganic insulating film, the fourth inorganic insulating film being disposed in contact with the third inorganic insulating film, and
   a fifth inorganic insulating film disposed between the light-emitting element and the fourth inorganic insulating film, the fifth inorganic insulating film being disposed in contact with the fourth inorganic insulating film, wherein
   the third inorganic insulating film and the fifth inorganic insulating film include silicon nitride, and
   the fourth inorganic insulating film includes aluminum oxide.

6. An electronic apparatus comprising:
   the electro-optical device according to claim 1, and
   a control unit that controls an operation of the electro-optical device.

7. An electro-optical device, comprising:
   a light-emitting element;
   a colored layer corresponding to the light-emitting element;
   a first inorganic insulating film disposed between the light-emitting element and the colored layer, the first inorganic insulating film including a lens surface having a curved shape;
   a second inorganic insulating film disposed between the light-emitting element and the first inorganic insulating film, the second inorganic insulating film being disposed in contact with the first inorganic insulating film;
   a third inorganic insulating film disposed between the light-emitting element and the second inorganic insulating film, the third inorganic insulating film being disposed in contact with the second inorganic insulating film;
   a fourth inorganic insulating film disposed between the light-emitting element and the third inorganic insulating film, the fourth inorganic insulating film being disposed in contact with the third inorganic insulating film; and
   a fifth inorganic insulating film disposed between the light-emitting element and the fourth inorganic insulating film, the fifth inorganic insulating film being disposed in contact with the fourth inorganic insulating film, wherein
   a film density of the second inorganic insulating film is higher than a film density of the third inorganic insulating film and a film density of the fifth inorganic insulating film,
   a film density of the fourth inorganic insulating film is higher than the film density of the third inorganic insulating film and the film density of the fifth inorganic insulating film, a thickness of the first inorganic insulating film is thicker than a thickness of the third inorganic insulating film, and a thickness of the fifth inorganic insulating film is thicker than the thickness of the third inorganic insulating film.

* * * * *